(12) United States Patent
Yabe et al.

(10) Patent No.: US 10,885,984 B1
(45) Date of Patent: Jan. 5, 2021

(54) AREA EFFECTIVE ERASE VOLTAGE ISOLATION IN NAND MEMORY

(71) Applicant: SanDisk Technologies LLC, Addison, TX (US)

(72) Inventors: Hiroki Yabe, Kanagawa (JP); Koichiro Hayashi, Kanagawa (JP); Takuya Ariki, Kanagawa (JP); Yuki Fujita, Kanagawa (JP); Naoki Ookuma, Kanagawa (JP); Kazuki Yamauchi, Misato (JP); Masahito Takehara, Tokyo (JP); Toru Miwa, Kanagawa (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/668,073

(22) Filed: Oct. 30, 2019

(51) Int. Cl.
  *G11C 16/04* (2006.01)
  *G11C 16/14* (2006.01)
  *H01L 27/11524* (2017.01)

(52) U.S. Cl.
  CPC .......... *G11C 16/14* (2013.01); *G11C 16/0408* (2013.01); *H01L 27/11524* (2013.01)

(58) Field of Classification Search
  CPC ................ G11C 16/14; G11C 16/0408; H01L 27/11524

USPC ..................................................... 365/185.29
See application file for complete search history.

(56) References Cited

U.S. PATENT DOCUMENTS

| 2006/0050560 A1* | 3/2006 | Shibata | G11C 16/24 365/185.18 |
|---|---|---|---|
| 2006/0118854 A1* | 6/2006 | Lee | H01L 27/115 257/315 |
| 2013/0026566 A1* | 1/2013 | Kutsukake | H01L 21/761 257/336 |

* cited by examiner

*Primary Examiner* — Tha-O H Bui
(74) *Attorney, Agent, or Firm* — Dickinson Wright PLLC; Steven Hurles

(57) ABSTRACT

A memory device comprising a semiconductor substrate in which a memory cell region and a peripheral circuitry region are defined, wherein the memory cell region has a plurality of non-volatile memory cells arranged in one or more arrays and the peripheral circuitry region has at least one sense amplifier region comprised of at least one low voltage transistor. Further, a deep N-well region is formed in the substrate, wherein the memory cell region and the peripheral circuitry region are placed on the deep N-well region such that, in the event that a high erase voltage (VERA) is applied to the memory cell region during an erase operation, the high erase voltage is applied to all terminals of the at least one low voltage resistor, thereby protecting the low voltage transistor by preventing it from experiencing a large voltage difference between its terminals.

20 Claims, 22 Drawing Sheets

AREA EFFECTIVE ERASE VOLTAGE ISOLATION IN NAND MEMORY

TECHNICAL FIELD

This disclosure relates to non-volatile memory storage systems in solid-state drives or other devices, including but not limited to flash drives or embedded/removable flash packages. More specifically, this disclosure relates to a memory structure scheme that effectively isolates and protects low voltage components from a high erase voltage (VERA) with respect to, namely, NAND (NOT-AND)-type memory, in such a manner so as to conserve chip area and reduce the read latency of the memory structure.

BACKGROUND

In the computing industry, one of the critical metrics that is driving innovation is the speed at which a computing device operates. An integral factor in achieving a fast computation speed is the speed of the memory devices that are essential to the operational power of the computing devices. Memory circuits, including, for example, dynamic random access memory ("DRAM"), are comprised of a large number of memory cells that are arranged in one or more memory arrays, with each array comprising a plurality of rows and columns. A processor stores and retrieves data from each memory cell location. Accordingly, the quicker the processor can access the data from the memory cells, the more quickly it can utilize the data to perform a computation or execute a program.

Taking DRAM as one example, it is a type of semiconductor memory that is generally described as comprised of a capacitor that is connected by a pass transistor to a bit line (or digit line or column line) of a memory array structure, wherein the bit or digit line is connected to a multitude of cells arranged in a column. A word line of the memory array structure is also connected to a multitude of cells, these cells being arranged in a row. In operation, if the word line is ascertained, the transistor is opened and the capacitor is connected to the bit line. The memory cell stores binary information in the form of a stored charge on the capacitor and when the pass transistor is opened, the charge will dissipate over the bit line (digit line), leading to a voltage change. However, the capacitor in each DRAM cell discharges slowly on account of various leak currents and, therefore, the DRAM cells must be repeatedly recharged at certain intervals. Therefore, although DRAM is beneficial because of its simple design of one transistor and one capacitor per bit (which allows for higher memory density, or more bits per chip) and speed, continuous power is needed in order for it to maintain its charge and, as a result, to retain the data. Accordingly, this type of memory is referred to as volatile memory.

Thus, due to emerging technology and market forces, non-volatile memory storage is steadily being used preferentially in certain applications. Such memory storage types comprise integrated circuit assemblies or interconnected flash components in which stored data can be persistently retained even during a planned, as well as unplanned, interruption of power. As a result, non-volatile memory is a powerful storage solution with respect to many computing, consumer electronic, and stand-alone external storage (e.g., USB drives) devices that require frequent programming and erasing of substantial amounts of data. Advances in non-volatile memory structures have led to significant increases in their storage density capability and a reduction in power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein the threshold voltage of the resulting transistor is controlled by and dependent upon the amount of charge that is retained on the floating gate. Specifically, in a switch-like manner, the minimum amount of voltage that must be applied to the control gate before the transistor is activated to permit conduction between its source and drain regions is, therefore, determined by the level of charge that is retained on the floating gate. As a result, bit-value data can be programmed onto and erased from the memory cell by precisely changing the level of charge on a floating gate in order to change the threshold voltage characteristic of the transistor. In an array structure, the memory cells are addressable by word lines (rows) and bit lines (columns). One type of non-volatile memory storage that is defined by this general structure is referred to as NAND flash memory due to its electrical characteristics, which are based on the NAND logic gate.

Concerning any type of memory device, a significant limitation on the operating speed of a computing device is the time that is required to transfer data between the processor and the memory circuit under a read or write data transfer. One parameter that quantifies this aspect of performance is referred to as "read latency," which is defined as the period of time between registration in the memory device of a read command from the processor and the availability of the accessed data on, for example, a data bus. As understood in the art, read latency is partly dependent upon the bit line capacitance of the bit lines of the memory array. Accordingly, an approach to reducing the read latency in volatile and non-volatile memory devices alike is to decrease the word line and/or bit line length of the memory structure in order to reduce the associated bit line capacitance. One element of a memory structure that can have a significant impact on the bit line length is the amount of control circuitry (commonly referred to as the "periphery circuitry") required by each memory plane of the memory structure. In certain embodiments, the control circuitry increases the overall height of a memory array, thereby increasing the bit line length and leaving less remaining space for the actual memory storage elements given a fixed die size. As described in greater detail below, elements of the control circuitry operate at low voltages and, therefore, must necessarily be protected from the high voltages that are applied to the memory array to conduct memory operations, such as an erase operation. These isolation components further compound the amount of space occupied by the control circuitry. Accordingly, there is an important need for mechanisms for isolating the low voltage components of a memory structure while maximizing the available space for the storage elements and reducing the resulting read latency of the device. There is a further need for achieving these performance characteristics in a non-volatile memory structure in order to take advantage of the considerable benefits of non-volatile memory over volatile memory that are described above.

SUMMARY

Various embodiments include a memory device comprising: a semiconductor substrate in which a memory cell region and a peripheral circuitry region are defined, wherein the memory cell region has a plurality of non-volatile memory cells arranged in one or more arrays and the peripheral circuitry region has at least one sense amplifier region comprised of at least one low voltage transistor. Further, a deep N-well region is formed in the substrate, wherein the memory cell region and the peripheral circuitry region are placed on the deep N-well region such that, in the event that a high erase voltage (VERA) is applied to the memory cell region during an erase operation, the high erase voltage is applied to all terminals of the low voltage transistor, thereby preventing the low voltage transistor from experiencing a large voltage difference between its terminals.

Other embodiments include a memory device that comprises: a semiconductor substrate in which a memory cell region and a peripheral circuitry region are defined, wherein the memory cell region has a plurality of non-volatile memory cells arranged in one or more arrays and the peripheral circuitry region has at least one sense amplifier region and at least one sense amplifier driver region. Each of the sense amplifier region and sense amplifier driver region is comprised of at least one low voltage transistor. Additionally, the memory device comprises at least one controller operable to communicate with the memory cell region, wherein the at least one sense amplifier driver region is operatively connected to the controller and the at least one sense amplifier region and is operable to provide control signals to the memory cell region. Further, a voltage isolation circuit is operatively connected to the sense amplifier driver region such that, in the event a high erase voltage (VERA) is applied to the memory cell region during an erase operation, the at least one low voltage transistor of the sense amplifier driver region is effectively isolated from the high erase voltage (VERA).

Additional embodiments include a method for effectively isolating a low voltage sense amplifier region of a non-volatile memory device from a high erase voltage (VERA) applied during a memory erase operation, wherein the method comprises: in a memory device having a semiconductor substrate in which a memory cell region and a peripheral circuitry region are defined, and wherein the peripheral circuitry region has at least one sense amplifier region comprised of at least one low voltage transistor, forming a deep N-well region in the semiconductor substrate and placing the memory cell region and the peripheral circuitry region on the deep N-well region such that, in the event a high erase voltage (VERA) is applied to the memory cell region during an erase operation, the high erase voltage (VERA) is applied to all terminals of the low voltage transistor, thereby preventing the low voltage transistor from experiencing a large voltage difference between its terminals.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1:
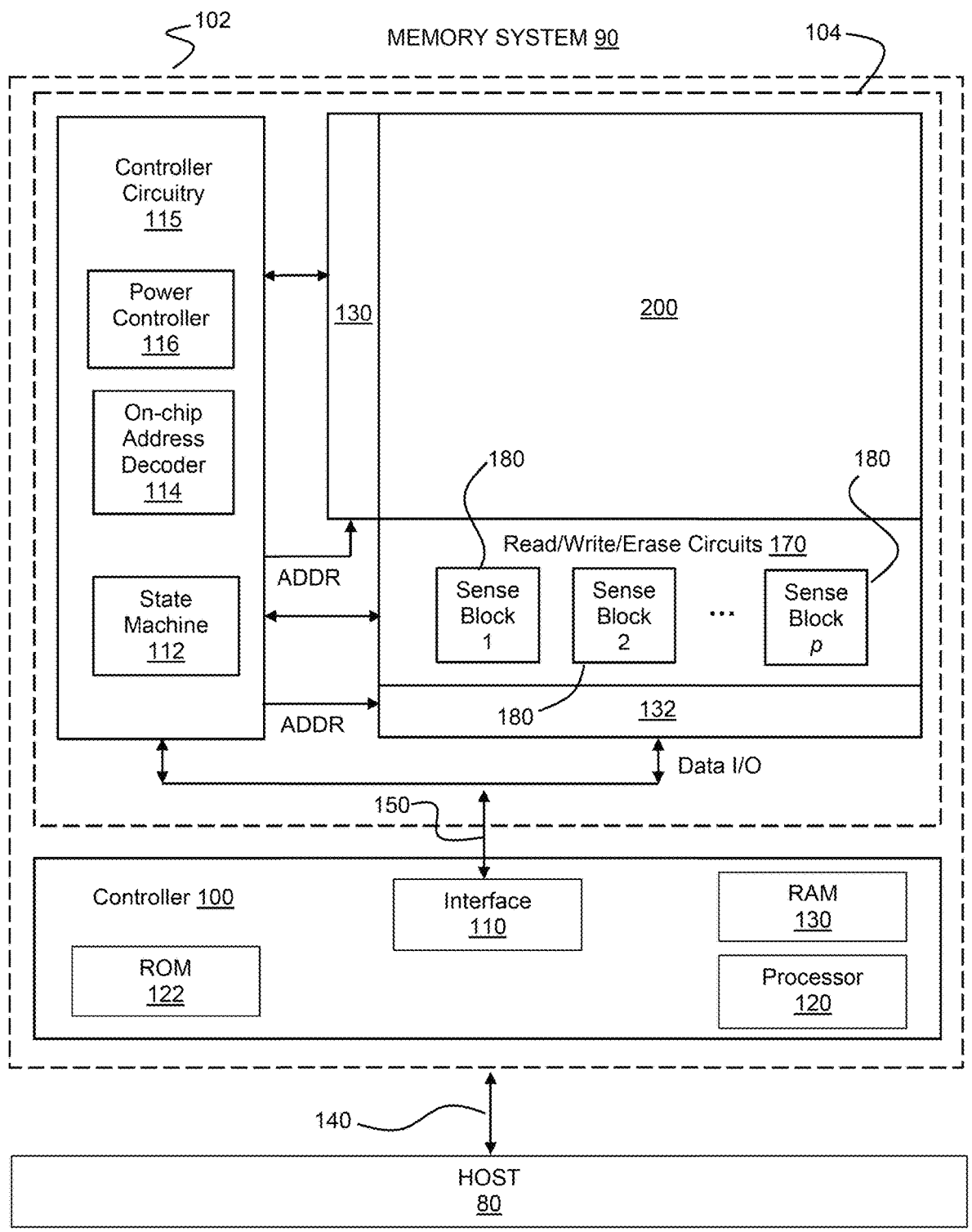
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

Figure 2:
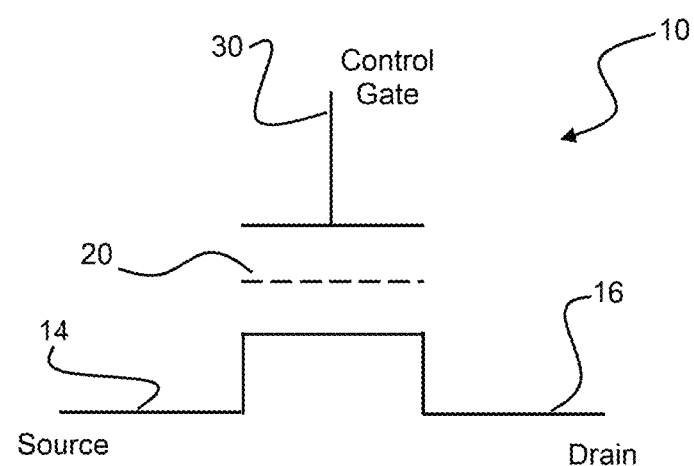
FIG. 2 schematically depicts a non-volatile memory cell, in accordance with exemplary embodiments.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3A:
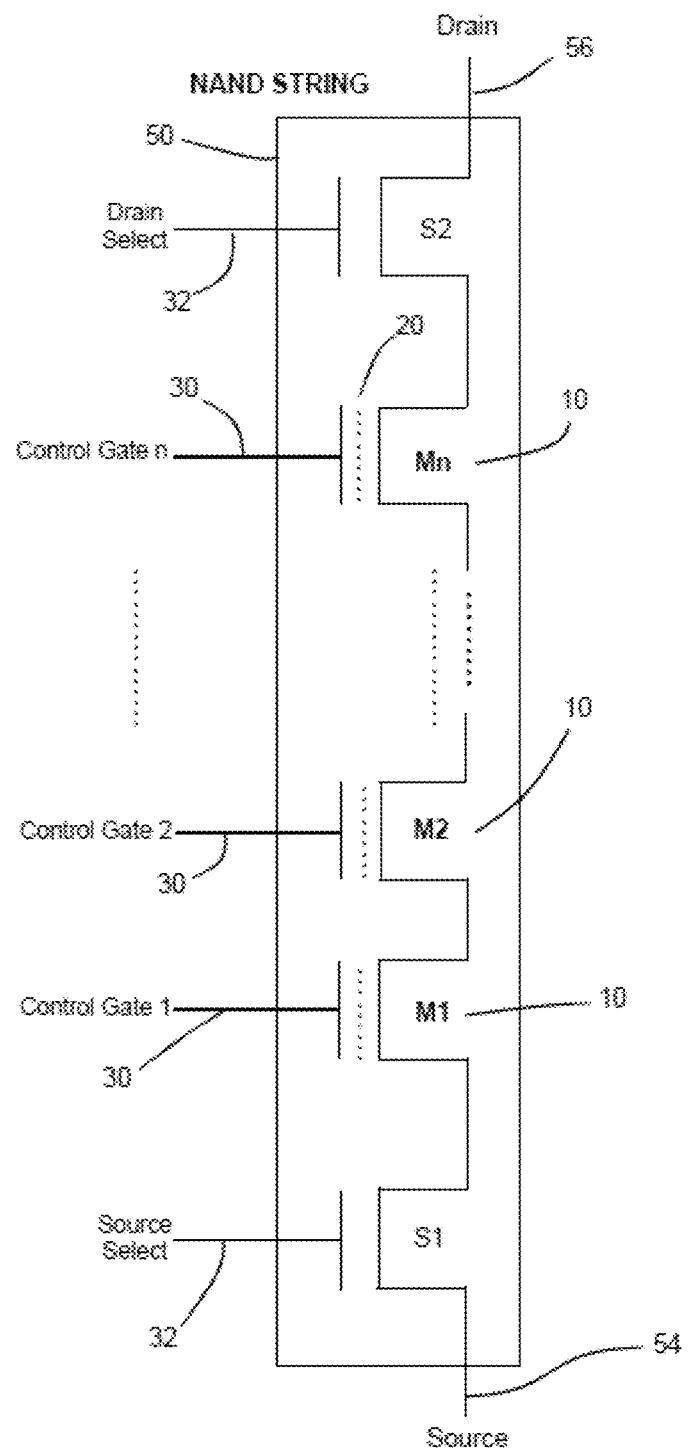
FIG. 3A schematically depicts a series of NAND-type memory cells organized into a string, in accordance with exemplary embodiments.

According to certain exemplary embodiments, the individual memory cells 10 are organized into strings in which the memory cells are placed in series. For example, depicted in FIG. 3A is an exemplary embodiment of a string 50 comprising NAND-type memory cells in which the series of the cells' respective transistor elements M1, M2, . . . , Mn (wherein "n" may equal 4, 8, 16, or higher) are daisy-chained with respect to their sources and drains. Further, as mentioned above with respect to FIG. 2, each memory cell's transistor 10 in the string 50 has a charge storage element 20 (e.g., a floating gate) for storing a certain amount of charge so as to represent an intended memory state of that cell, wherein each memory transistor 10 comprises a control gate 30 that allows control over the read and write memory operations. Present at the source terminal 54 and the drain terminal 56 of the string 50 are select transistors S1, S2 that control the transistor's connection to the outlying memory array. Specifically, when the source select transistor S1 is turned on, the source terminal 54 of the string 50 is coupled to a source line (SL). Likewise, when the drain select transistor S2 is turned on, the drain terminal 56 is coupled to a bit line (BL) of the memory array.

Figure 3B:
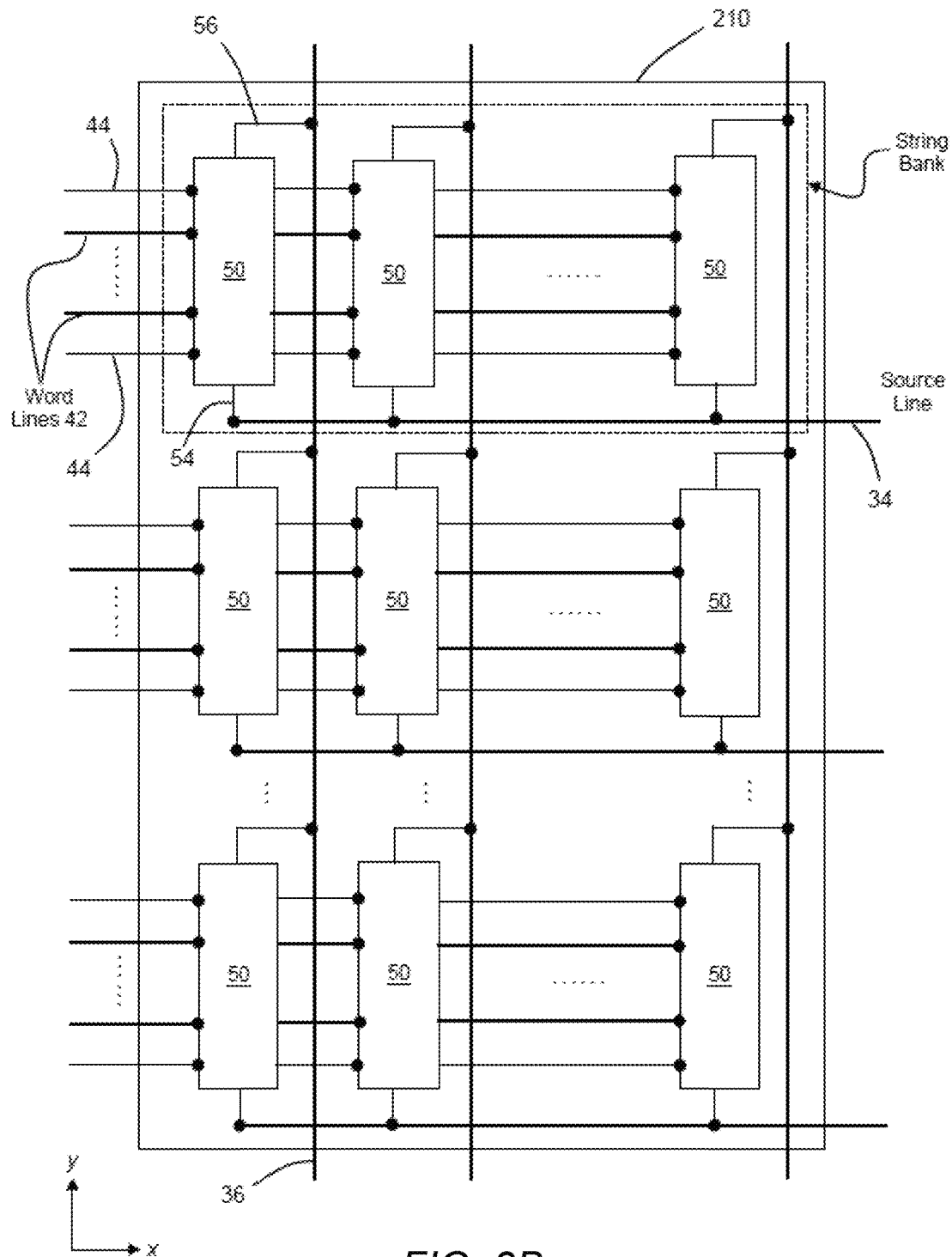
FIG. 3B schematically depicts a two-dimensional array of memory cells, comprising a plurality of NAND-type strings, such as the type depicted in FIG. 3A, in accordance with exemplary embodiments.

Expanding outward a hierarchical level, FIG. 3B is a schematic diagram depicting an exemplary embodiment of a memory array 200 (such as memory array 210) comprised of a plurality of NAND strings 50 of the type illustrated in FIG. 3A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Figure 4:
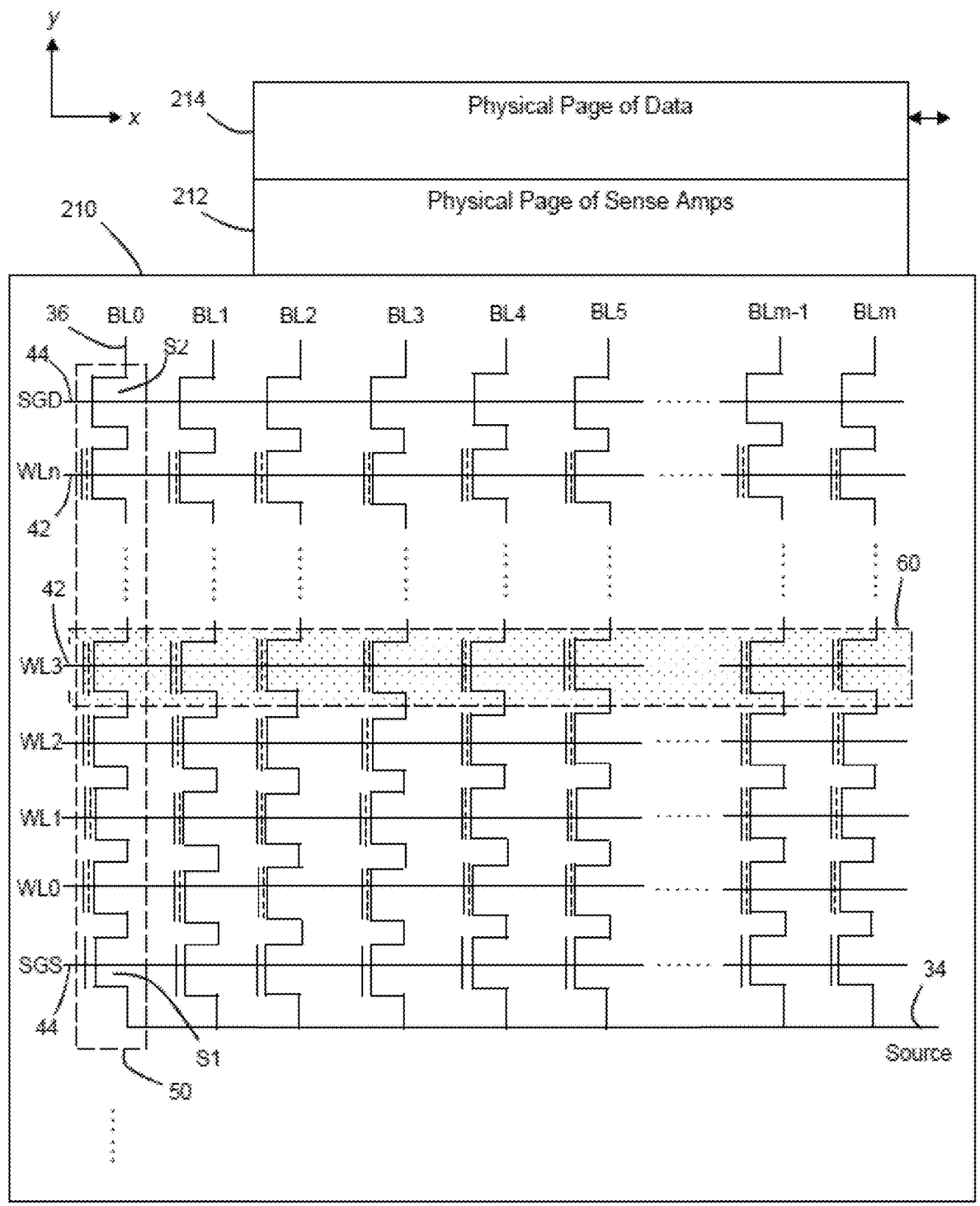
FIG. 4 depicts a page of memory cells being sensed or programmed in parallel, and in relation to a memory array organized in a NAND-type configuration, in accordance with exemplary embodiments.

Referring now to FIG. 4, there is depicted a detailed illustration of one bank of NAND strings 50 of a memory array 210 according to an exemplary embodiment thereof. This view is particularly useful in visualizing a row-by-row configuration of the memory array 210, wherein each row may be referred to as a "page." Accordingly, a physical page (e.g., page 60 denoted in FIG. 4) is a group of memory cells 10 that is enabled to be sensed or programmed in parallel. In fact, in such a configuration, a page is the smallest unit of the memory device that may be programmed or written to. Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, . . . , BLm-1, and BLm, as depicted in FIG. 4). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

Figure 5:
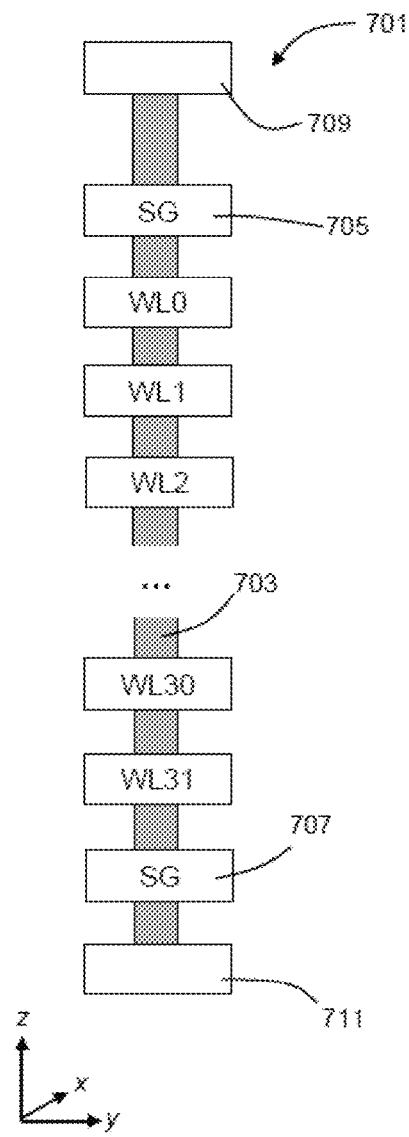
FIG. 5 depicts a vertical NAND-type string, in accordance with an exemplary embodiment.

In FIGS. 3A-3B and 4 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a direction that is perpendicular to the x-y plane). As a result, three-dimensional memory structures increase the storage density but consume less chip surface. For example, in FIG. 5 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 5, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 3A-3B, 4 and 5, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a selfcontained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by the row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 3A-3B and 4, respectively, in the vertical direction that is perpendicular to the x-y plane (i.e., the z direction), such that each y-z plane of the three-dimensional structure corresponds to the page structure of FIG. 4, wherein each plane is at differing locations along the x axis. As a result, the global bit lines (e.g., BL0, . . . , BLm, of FIG. 4) each run across the top of the memory structure to an associated sense amplifier (e.g., SA0, . . . , SAm). Accordingly, the word lines (e.g., WL0, . . . , WLn, of FIG. 4), and the source and select lines (e.g., SSL0, . . . , SSLn, and DSL0, . . . , DSLn, respectively) extend in the x direction, with the bottom of each NAND string (e.g., string 50) connected to a common source line.

Figure 6A:
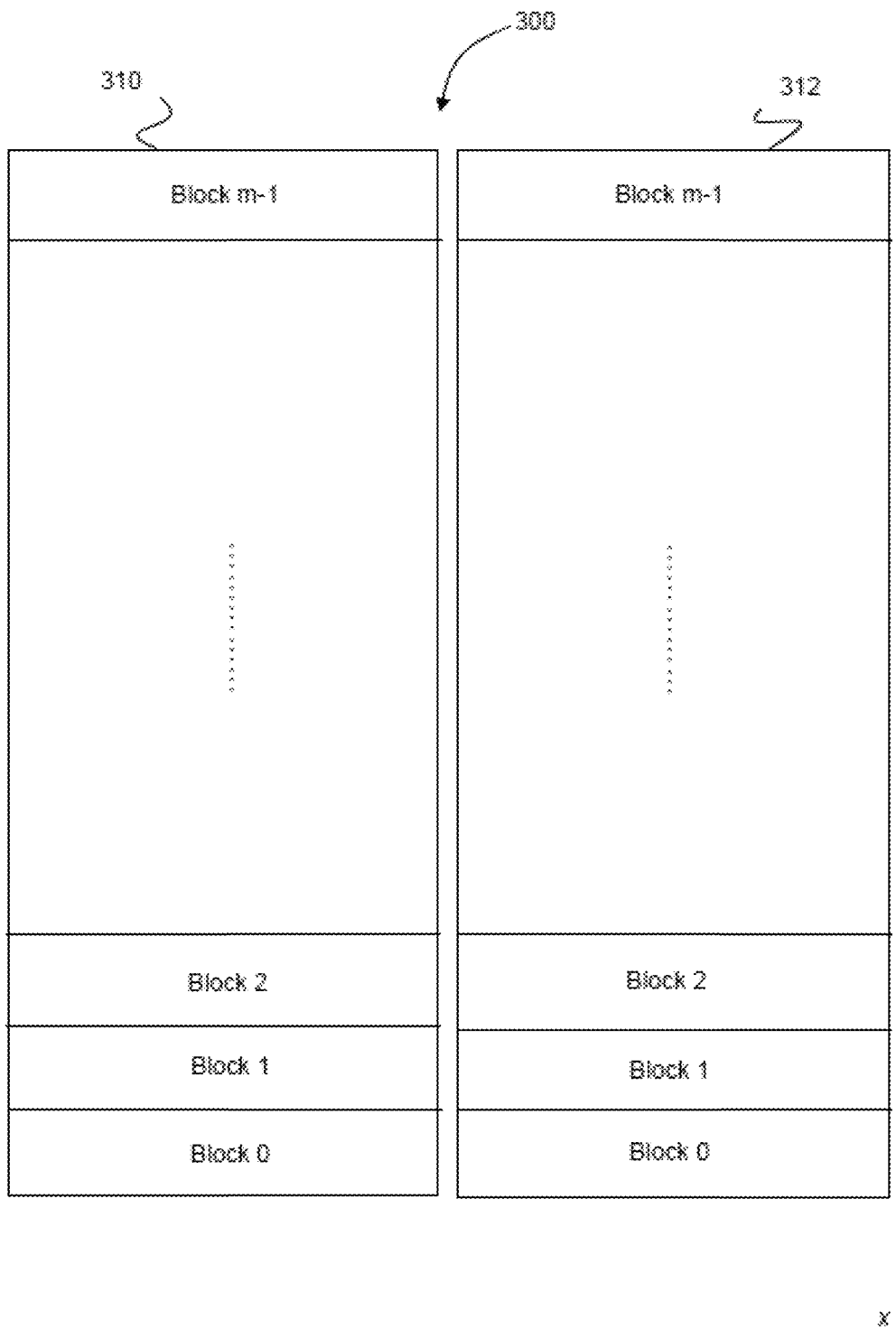
FIG. 6A is a block diagram of a cross-sectional view of a three-dimensional memory structure comprising two planes, in accordance with exemplary embodiments.
Figure 6B:
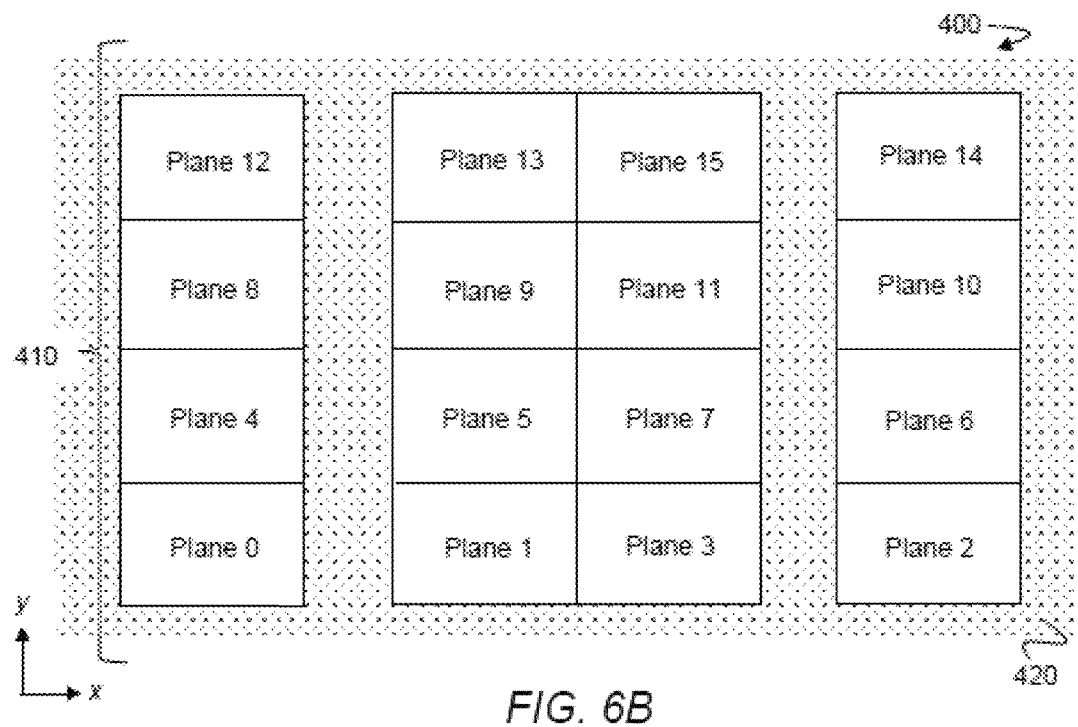
FIG. 6B is a block diagram of a top view of a three-dimensional memory structure comprising sixteen (16) planes, in accordance with an exemplary embodiment.
Figure 6C:
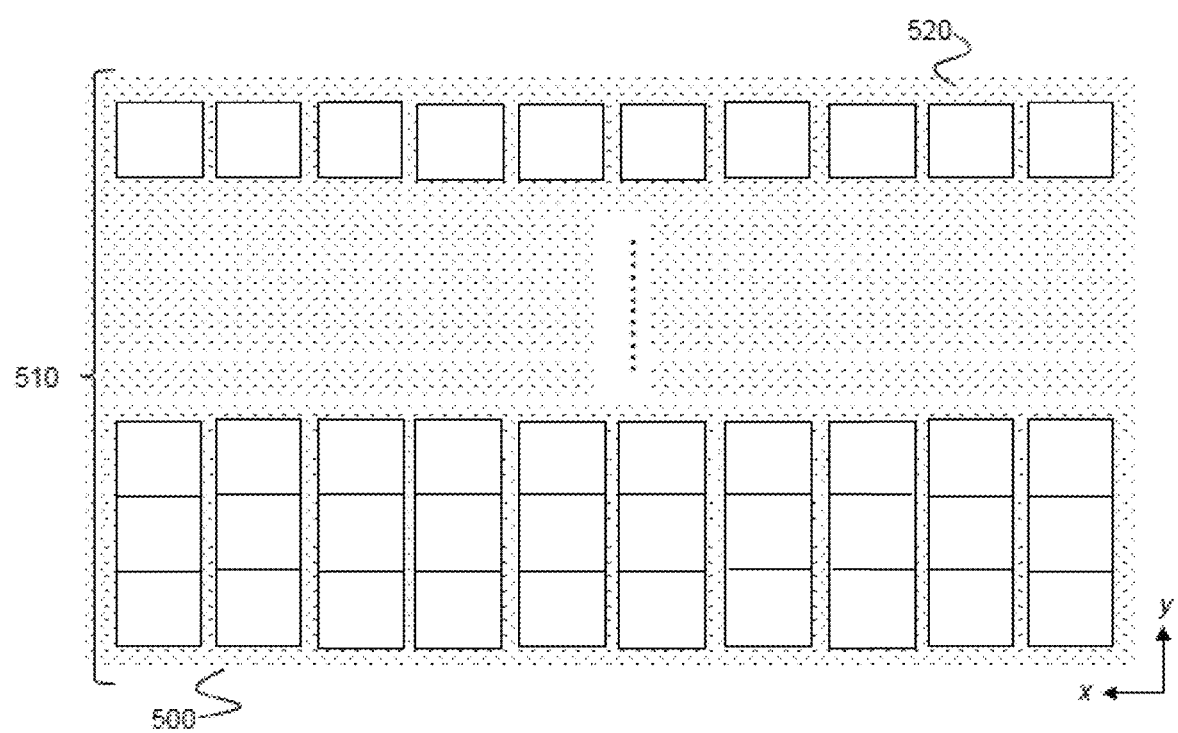
FIG. 6C is a block diagram of a top view of a three-dimensional memory structure comprising a plurality of planes, in accordance with exemplary embodiments.

Referring now to FIGS. 6A-6C, there are depicted exemplary embodiments of an illustrative portion of, for example, a three-dimensional NAND-type memory (such as memory structures 200, 210 described above), which is divided into multiple planes with the specific objective of, in part, decreasing the overall height of the memory array with respect to the underlying semiconductor substrate, thereby reducing the bit line and/or word line length to minimize the read latency as discussed above. In one example, depicted in FIG. 6A is a block diagram of a cross-sectional view of a memory structure 300 that has been divided into two substantially equal planes 310 and 312. Indicated in FIG. 6A is the x-z plane, which lies perpendicular to the underlying semiconductor substrate (not shown). Further, each plane 310, 312 is divided into an "m"-number of blocks 310 of memory cells (in which "m" is an integer greater than zero), wherein as mentioned above, each memory block 310 constitutes one unit of erase in which all memory cells within the same block are erased together. Memory cells may also be grouped together in functional blocks for other purposes that include, but are not limited to, organizing the memory structure 300 in order to enable the signaling and selection circuits. According to one example, each of planes 310, 312 may comprise between 1000 to 2000 blocks 310. In such a two-plane memory structure 300, it is possible, according to an exemplary embodiment, to achieve a 16 KB bit line and/or word line length.

FIG. 6B is a block diagram of the top view of another exemplary embodiment of a memory structure 400 that is divided into sixteen (16) planes 410 (see Plane 0, Plane 1, Plane 2, . . . , Plane 15), with each plane 410 further divided into one or more memory cell blocks (not shown) in a similar manner as described above with respect to FIG. 6A. The x-y plane lying parallel to the underlying semiconductor substrate 420 is further indicated. In this particular embodiment, the planes 410 are organized such that the even-numbered plane IDs (0, 2, 4, 6, 8, 10, 12, and 14) and the odd-numbered plane IDs (1, 3, 5, 7, 9, 11, 13, and 15) are, respectively, grouped together. According to one example of memory structure 400, each plane 410 may comprise approximately 800 memory cell blocks, resulting in a further decrease in the bit line and/or word line length to 4 KB. In such a configuration, a read latency of approximately 5 microseconds is attainable.

Depicted in FIG. 6C is a block diagram of the top view of a further exemplary embodiment of a memory structure 500 (again, lying in the x-y plane that is parallel to the underlying substrate 520), which is divided into a substantially higher number of planes 510 in comparison to the embodiments of FIGS. 6A and 6B. According to one exemplary embodiment, the number of planes 510 may be in the hundreds. Based upon this configuration, it is possible, according to this embodiment, that each plane 510 comprises approximately 80 memory cell blocks (not pictured), allowing for only a 2 KB bit line and/or word line length in which a sub-microsecond read latency may be achieved.

The embodiments of FIGS. 6A-6C illustrate several non-limiting examples of three-dimensional memory structures that demonstrate a methodology of breaking up a memory structure into multiple smaller co-planar planes placed in proximity to each other along an x-y plane parallel to the semiconductor surface, as a sheer method of shrinking the height of the memory structure with respect to the semiconductor surface to beneficially decrease the bit line and/or word line length. Theoretically, a memory structure may be broken into any number of different blocks and planes, limited only by the dimensions, material constraints, and physical properties of the semiconductor chip. However, as mentioned above, associated with each plane is its own periphery circuitry necessary for it to operate. Thus, populating the semiconductor device with a greater number of individual adjacent planes increases the amount of chip space needed for the overhead circuitry and, consequently, adversely effects the ratio of periphery circuitry to memory storage in the device. This results in a more complex memory device with potentially less memory capacity and a higher per-bit cost. FIGS. 7A-7D depict an exemplary embodiment of a three-dimensional non-volatile memory structure comprised of, for example, NAND-type memory cells, in which, in conjunction with dividing the memory structure into a moderate number of co-planar planes along the semiconductor substrate, a sub-plane architecture is also utilized to produce the necessary reduction in the bit line and/or word line length to achieve an approximate sub-microsecond read latency without compromising the ratio between the periphery circuitry and memory storage in the device.

Figure 7A:
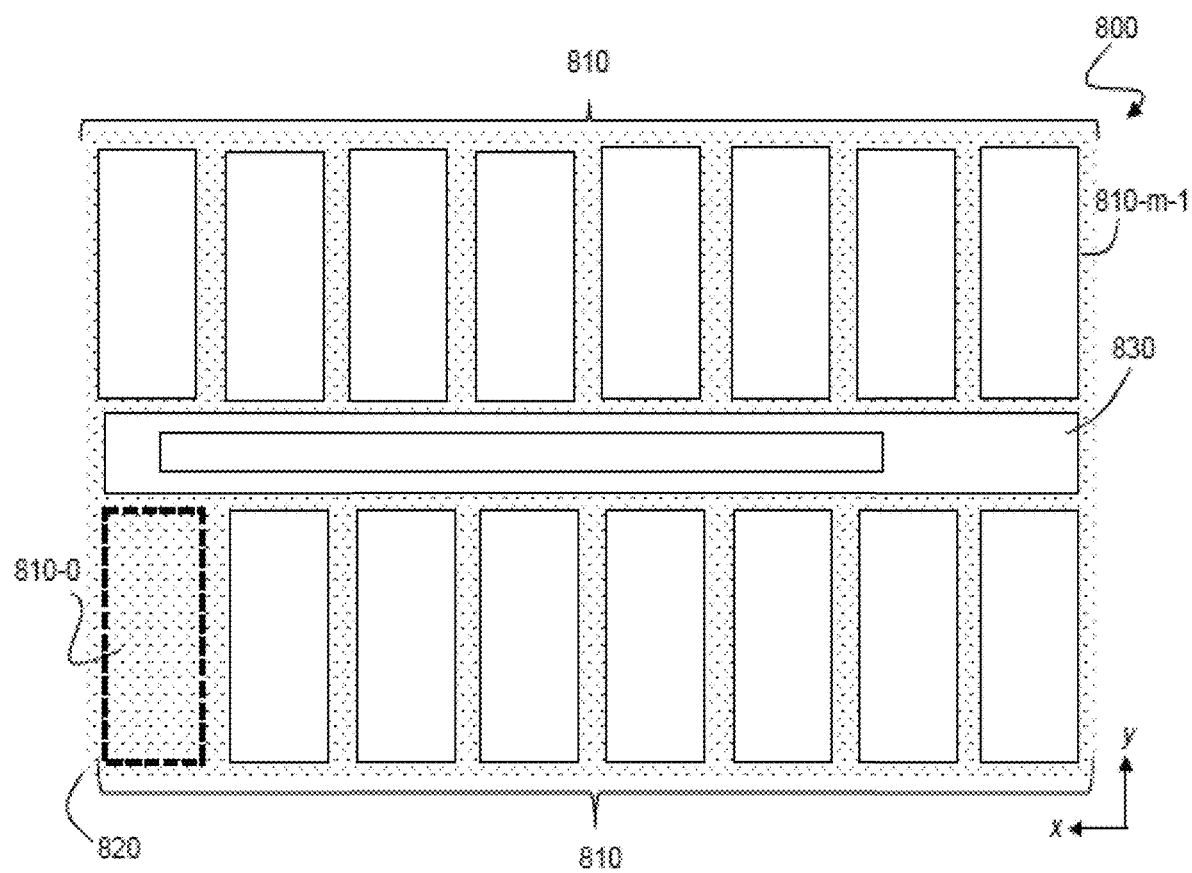
FIG. 7A is a block diagram of a top view of a three-dimensional memory structure comprising sixteen (16) planes, in accordance with a further exemplary embodiment.
Figure 7B:
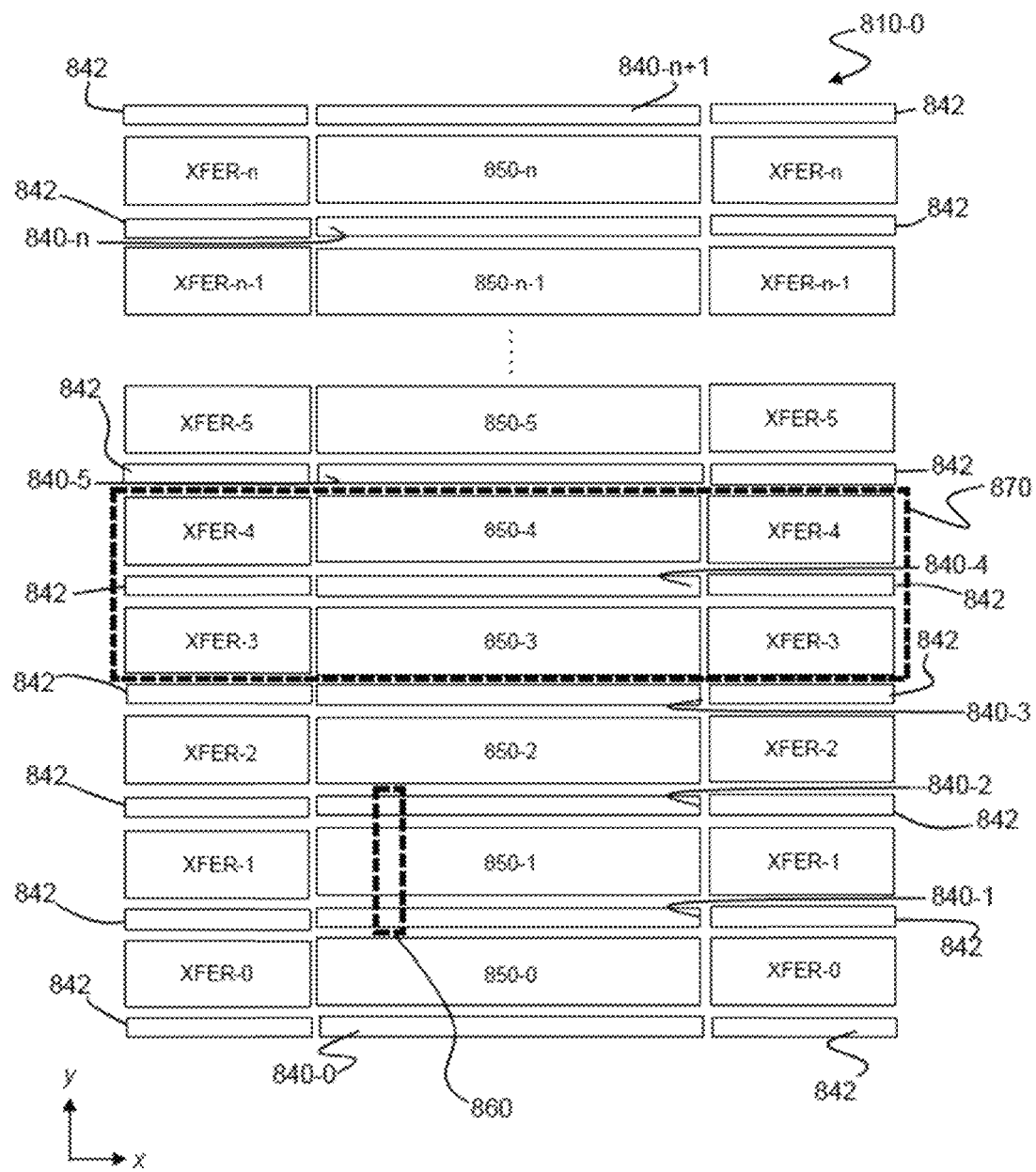
FIG. 7B is a block diagram of a top view of an example plane of the memory structure of FIG. 7A, illustrating a sub-plane layout of the example plane, in accordance with exemplary embodiments.

Accordingly, beginning with FIG. 7A, depicted is a block diagram of the top view of a memory structure 800, lying in an x-y plane that is parallel to a semiconductor substrate 820, according to an exemplary embodiment. As shown, the memory structure 800 is comprised of a "m"-number of co-planar planes (810-0, . . . , 810-$m$−1). In this exemplary embodiment, the memory structure 800 has a total of sixteen planes (i.e., "m" equals 16) arranged such that the population of planes is bisected by a configuration of the associated control circuitry 830. FIG. 7B illustrates a top view (along the x-y plane that is parallel to the semiconductor substrate) of an example one of the planes (810-0, . . . , 810-$m$−1), according to an exemplary embodiment. As shown, plane 810-0 further comprises an "n"-number of sub-planes (850-0, . . . , 850-$n$) positioned adjacent and in close proximity to one another within the x-y plane. In this particular embodiment, the three-dimensional memory array of plane 810-0 is partitioned into eight sub-planes (i.e., "n" equals eight). Further, by separating the plane 810-0 into the several sub-planes (850-0, . . . , 850-$n$) in a side-by-side configuration, the associated periphery circuitry, namely the sense amplifier and sense amplifier driver regions (see 840-0, . . . , 840-$n$+1 and 842, respectively), are correspondingly partitioned within the x-y plane, alternating between the sub-planes (850-0, . . . , 850-$n$) such that each of the sense amplifier regions (840-0, 840-$n$+1) is beneficially shared between the two sub-planes that are immediately adjacent that particular sense amplifier region with the exception of the sense amplifier regions disposed at the terminating ends of the plane (e.g., sense amplifier regions 840-$n$+1 and 840-0 in plane 810-0, respectively). Several significant objectives are obtained by virtue of this configuration. For example, by segmenting each plane into the smaller sub-planes (850-0, . . . , 850-$n$) and, likewise, interweaving between the sub-planes the periphery circuitry associated with each sub-plane, the bit lines only span the length of a sub-plane rather than a larger area, such as the entire memory array, of the plane. Accordingly, taking the embodiment of FIG. 7B as one illustrative example, the length of the bit lines is reduced by approximately ⅞ths as a result of there being eight sub-planes. In addition, by also partitioning the periphery circuitry in a manner that corresponds to the division of sub-planes, a reduction in the bit line length is obtained without using any additional surface area of the semiconductor device for the periphery circuitry. Furthermore, due to the sense amplifier regions (840-0, . . . , 840-$n$+1) being shared by two adjacent sub-planes (850-0, . . . , 850-$n$), the area occupied by the sense amplifier regions is effectively reduced by approximately one half despite the creation of the individual sub-planes (850-0, . . . , 850-$n$) (as best seen in FIG. 7D).

Figure 7C:
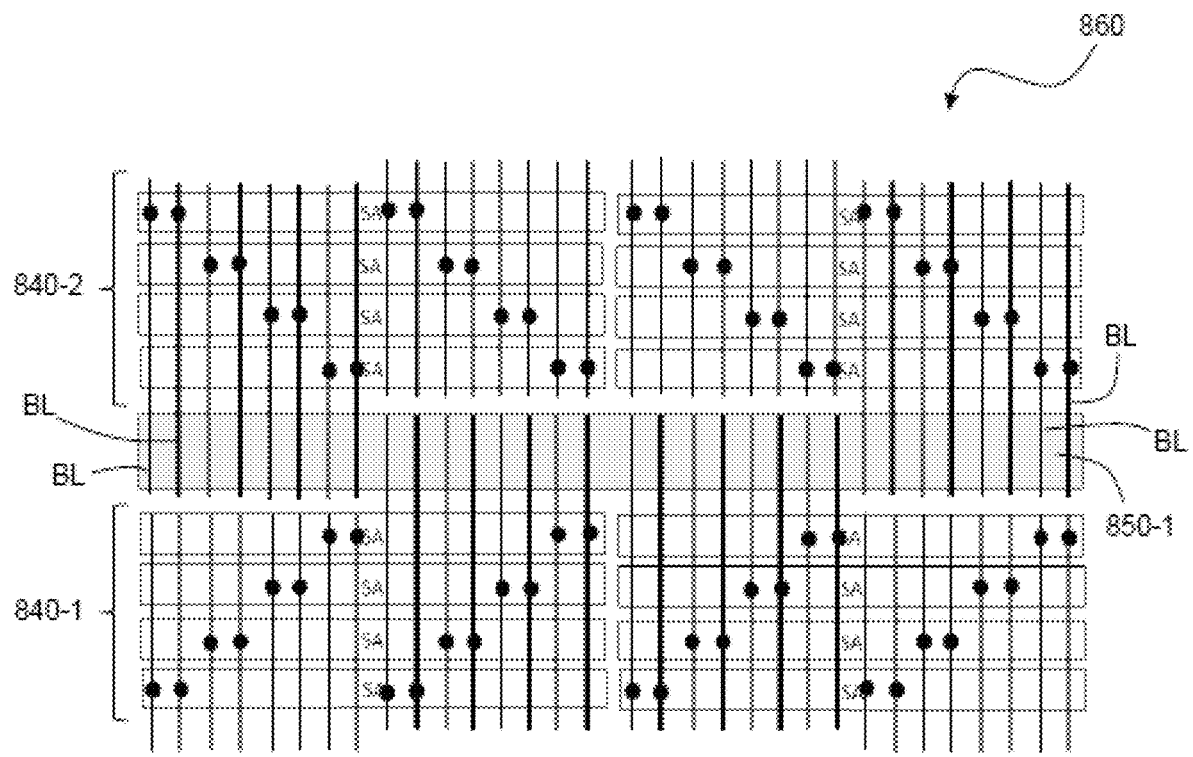
FIG. 7C is a top view of an example section of the plane and sub-plane structure of FIG. 7B, depicting a bit line separation layout of a sub-plane in greater detail, in accordance with exemplary embodiments.

Referring now to FIG. 7C, there is depicted a representative section 860 of the example sub-plane structure in FIG. 7B for purposes of illustrating the shared sense amplifier region and the bit line separation in accordance with an exemplary embodiment. In this particular embodiment, sub-plane 850-1 is a 32-bit memory array that, accordingly, comprises 32 bit lines (BL), and is positioned adjacent the sense amplifier region 840-1 and adjacent sense amplifier region 840-2. As depicted, each of the sense amplifier regions 840-1 and 840-2 operates with respect to only a fraction (e.g., a half) of the 32 bit lines of the sub-plane 850-1 such that, together, the sense amplifier regions 840-1 and 840-2 control all of the 32 bit lines of the sub-plane 850-1 in a kind of interlocking functionality that likewise is carried out through the sense amplifier regions and adjacent sub-planes throughout the entire plane 810-0. Accordingly, with this configuration, each sense amplifier region of a plane, with the exception of the sense amplifier regions disposed at the terminating ends of the plane, can be connected to either of the two sub-planes that are adjacent the sense amplifier region.

The specific bit line configuration of the exemplary embodiment in FIG. 7C is based upon the assumption that this particular memory structure operates according to an even-odd voltage sense and, as such, the number of sense amplifiers is necessarily equal to half the number of bit lines (BL). However, a layout with the same characteristics is also feasible with respect to an ABL technique as well.

Figure 7D:
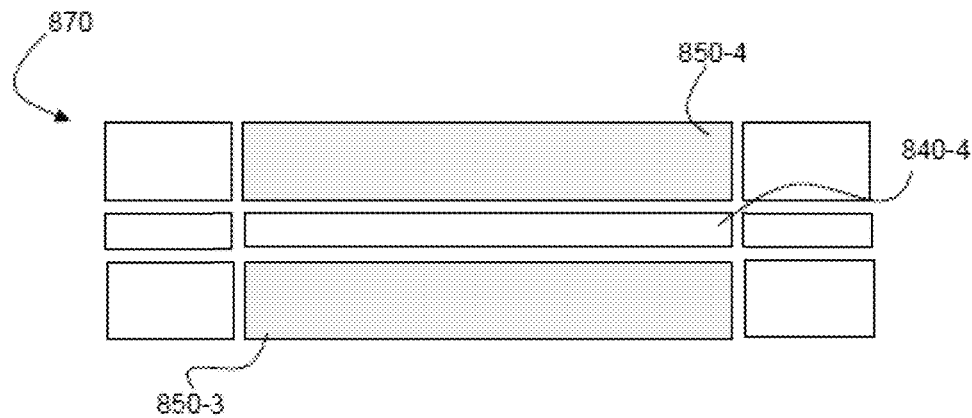
FIG. 7D is a further top view of another example section of the plane and sub-plane structure of FIG. 7B, depicting a shared sense amplifier region, in accordance with exemplary embodiments.

Illustrated in FIG. 7D is another representative section 870 of the plane 810-0 provided in FIG. 7B, depicting in larger detail the common sense amplifier region 840-4 that is shared between sub-planes 850-3 and 850-4. From this illustration, it can be seen that by employing a sense amplifier configuration that is shared between two sub-planes, it is possible to reduce the total aggregate area of the sense amplifier region in the plane (810-0) by approximately half.

Figure 8:
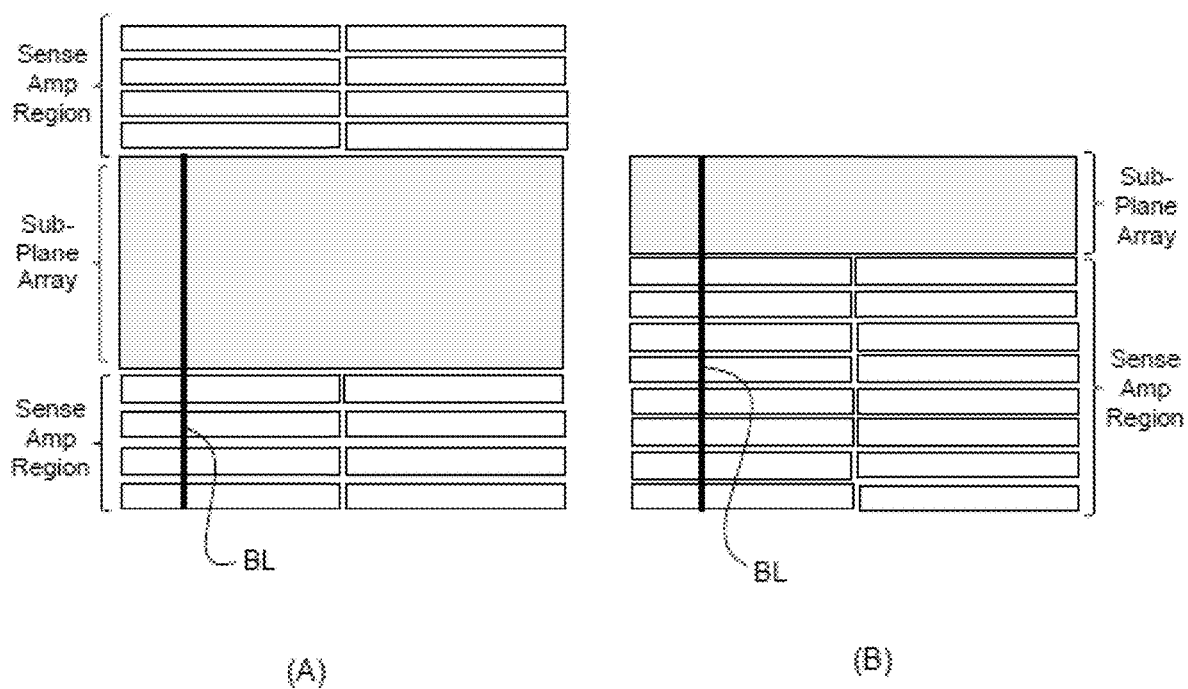
FIG. 8 is a block diagram of a top view of example sections of two alternative sub-plane configurations, placed side-by-side to form a comparison in order to demonstrate certain advantages of positioning the sense amplifier region on both sides of the associated sub-plane.

Additional important advantages of a sub-plane structure that is in accordance with the overall principles of the exemplary embodiment shown in FIGS. 7A-7D are illustrated in the comparison view provided in FIG. 8. As discussed above, the total bit line capacitance (which may be referred to as the "BLi-capacitance") is primarily determined by the bit line length. Therefore, in an adjacent and neighboring sub-plane structure such as the one that is pictured in FIG. 7B, the bit line (BL) only traverses its respective sub-plane and sense amplifier region such that the full length of the bit line is equal to the sum of the respective spans in the v-direction of the sub-plane and the sense amplifier region. In area "B" of FIG. 8, there is shown in a block diagram fashion the top view of an example section of a memory plane in which, contrary to the sub-plane structure exemplified in FIG. 7B, the sense amplifier region associated with the sub-plane array shown is positioned on only one side of the sub-plane array, which results in the majority of the total length of any bit line (e.g., BL) of the sub-plane array being over the sense amplifier region rather than over the sub-plane array. By contrast, area "A" of FIG. 8 depicts a top view of an equivalent example section of a memory plane having the sub-plane structure in accordance with the exemplary embodiment of FIG. 7B, in which the sense amplifier region associated with the sub-plane structure is bifurcated amongst two sides of the sub-plane array, wherein each sense amplifier region is shared between adjacent sub-planes. As a result, for a given bit line length (BL), the length of the bit line over the sense amplifier region is reduced by, for example, half, when comparing the configuration of area "A" to that of area "B" in FIG. 8. In addition, the area that is spared in the y-direction by the reduction in the length in the y-direction of the sense amplifier region may, in turn, be beneficially used to enlarge the sub-plane array, thereby resulting in an increase in the memory storage capacity and the per-bit cost while maintaining the same read latency performance. Thus, reducing the sense amplifier region within a memory structure in order to minimize the bit line capacitance that is occurring over the sense amplifier region is an important consideration.

It should be noted that although the exemplary embodiments described above with reference to FIGS. 7A-7D and 8 specify a memory structure having 16 planes (810-0, . . . , 810-$m$-1), with each plane having eight sub-planes (850-0, . . . , 850-$n$), and each sub-plane having 32 bit lines (BL), such an example is intended to be non-limiting such that any number of planes and sub-planes, and any density of memory cells (and, accordingly, bit lines and word lines), may be employed without departing from the scope of the disclosure, and limited only by practical limitations related to the materials and physical principles of semiconductor devices.

Figure 9:
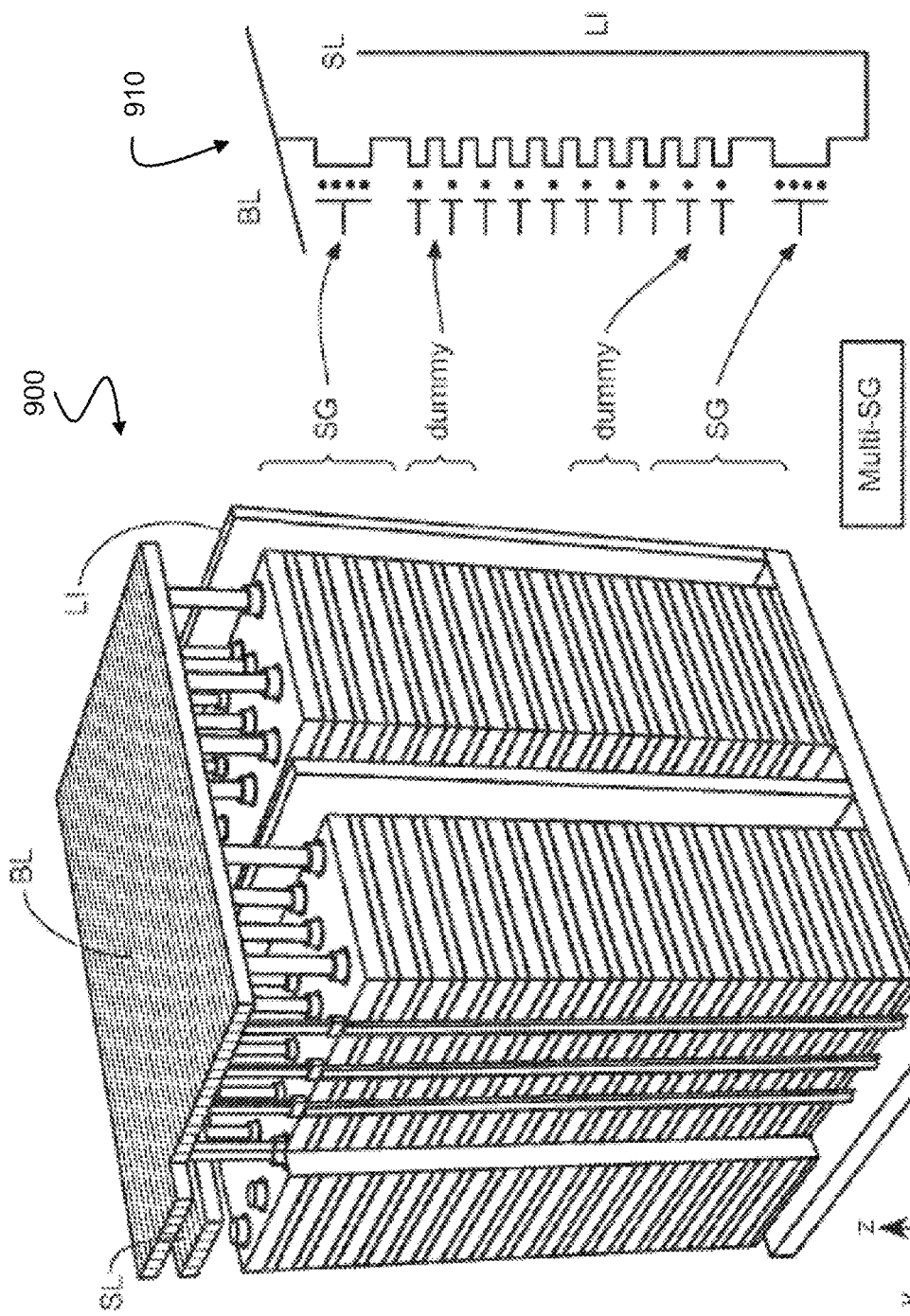
FIG. 9 is a perspective view of a representative subsection of a monolithic three-dimensional NAND-type memory array, in accordance with exemplary embodiments.

Referring now to FIG. 9, there is depicted an oblique perspective view of an example subsection of an embodiment of a three-dimensional NAND memory array 900 of the Bit Cost Scalable ("BiCS") type in which one or more memory device levels is formed above a single substrate. The example subsection corresponds to two of the page structures shown in FIG. 3B wherein, depending upon the particular embodiment, each may correspond to a separate memory block or may be different extensions of the same block. According to this embodiment, rather than lying in the same y plane, the NAND strings are pressed in they direction such that the NAND strings have a staggered configuration in the x-direction. Further, at the top of the array 900, the NAND strings are connected along global bit lines (BL) that span multiple of these subsections of the array 900 that run in the x direction. In addition, global common source lines (SL) also run across multiple subsections of the memory array 900 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 900. Depicted on the right side of FIG. 9 is a schematic representation of the fundamental elements of one of the vertical NAND strings 910 of the memory array 900. Similar to the NAND string 50 of FIG. 3A, the string 910 is comprised of a series of interconnected memory cells. The string 910 is connected to an associated bit line (BL) through a drain select gate (SGD). A source select gate (SDS) connects the string 910 to a global source line (SL) through an associated local source line (LI). Further included in this particular embodiment are several dummy cells located at the ends of the string 910. Due to their proximity to select gates (SGD, SDS) and, thereby, their susceptibility to disturbs, the dummy cells are not used to store user data.

Figure 10:
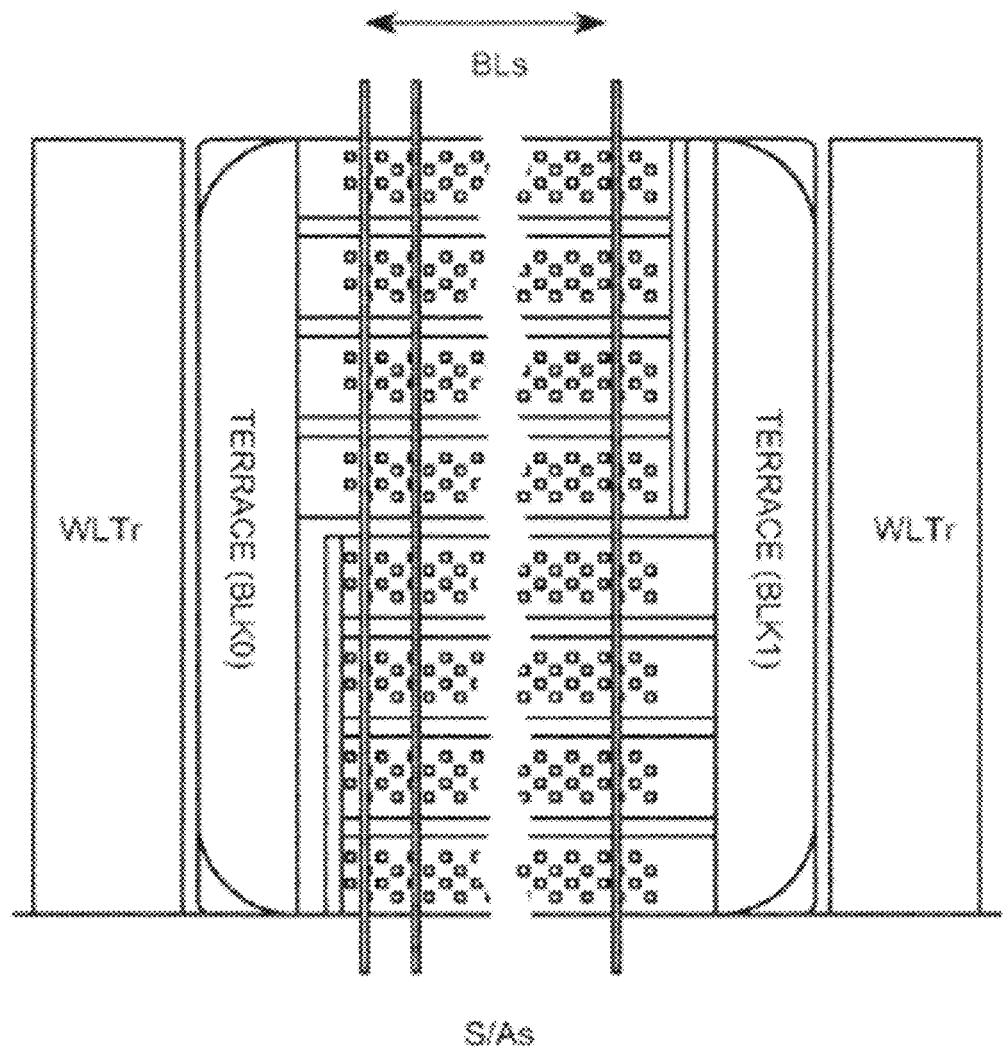
FIG. 10 is a top view of two representative blocks of the memory array of FIG. 9, in accordance with exemplary embodiments.

Turning to FIG. 10, there is shown a top view of two representative blocks (i.e., BLK0 and BLK1) of the array structure 900 of FIG. 9. According to this particular embodiment, each block is comprised of four extensions that extend from left to right. Further, the word lines and the select gate lines of each level also extend from left to right, wherein the word lines of the different extensions of the same block are commonly connected at a "terrace" from which they receive their various voltage levels by way of word line select gates (WLTr). It should also be noted that the word lines of a given layer of a block may be commonly connected on the far side from the terrace. Also, the selected gate lines can be individual, rather than common, for each level, thereby allowing for each extension to be individually selected. In addition, the bit lines (BLs) run vertically as depicted, and connect to the sense amplifier circuits (SAs) where, depending on the embodiment, each sense amplifier can correspond to a single bit line or be multiplexed to several bit lines.

Figure 11:
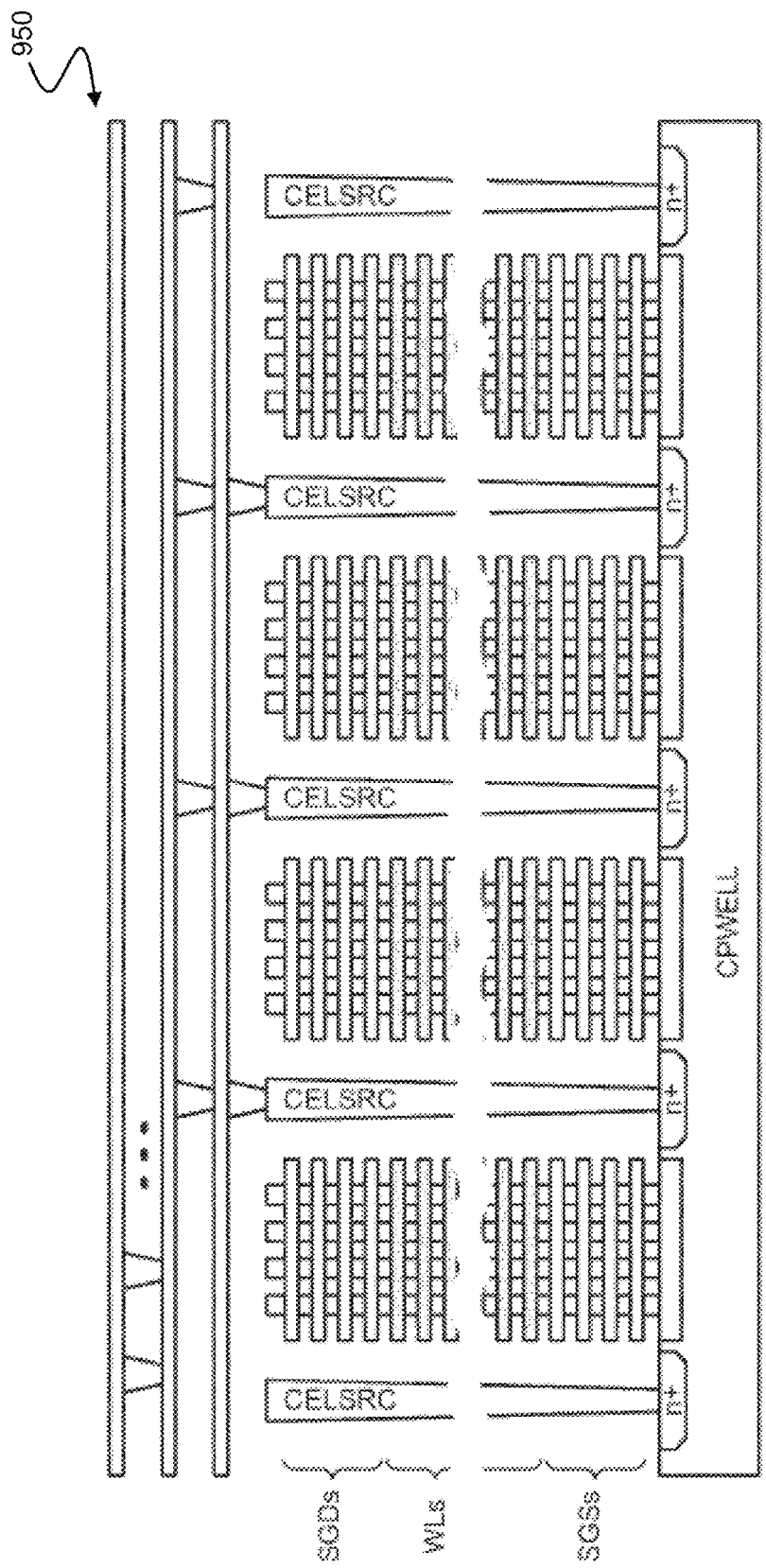
FIG. 11 is a side view of a representative block of the memory array of FIG. 9, in accordance with exemplary embodiments.

The side view provided in FIG. 11 shows the four extensions of an individual block 950 of the array structure 900 of FIG. 9 in greater detail. According to this particular embodiment, select gates (SGD, SDS) at either end of the NAND strings are formed with four layers, with the word lines (WLs) therebetween, all formed over a CPWELL. Accordingly, in order to select a given extension, the voltage level (VSG) of the select gates is set and the word lines (WLs) are biased according to the operation, either at a read voltage (VCGRV) for the selected word lines (WLs), or at a read-pass voltage (VREAD) for the non-selected word lines (WLs). The non-selected extensions may then be cut off by setting their select gates accordingly.

Figure 12A:
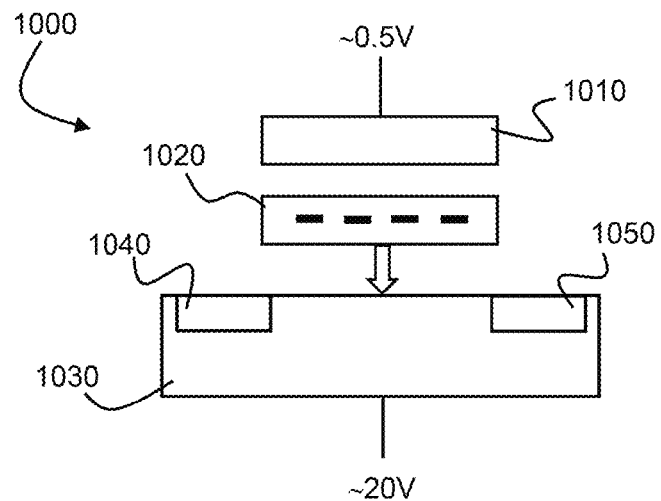
FIG. 12A illustrates a memory erase operation for a programmable threshold transistor of a two-dimensional memory structure, in accordance with exemplary embodiments.
Figure 12B:
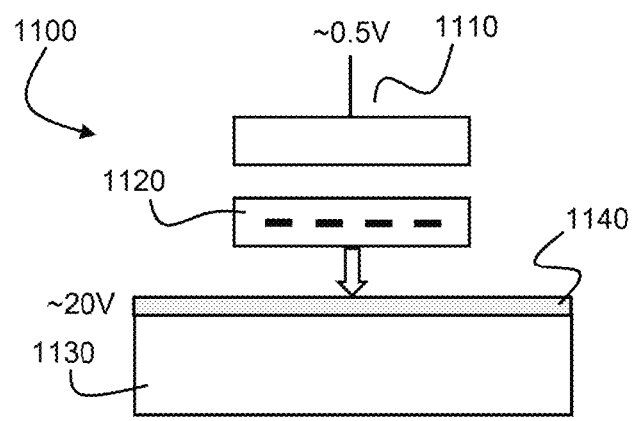
FIG. 12B illustrates a memory erase operation for a programmable threshold transistor of a three-dimensional memory structure, in accordance with exemplary embodiments.

Returning now to the programming and erase memory operations with respect to non-volatile memory, these two operations may be generally described in the following manner. As described above, each cell comprises a floating gate MOS transistor, wherein the floating gate (FG) is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the charge trapping layer (i.e., floating gate) by applying a low voltage to the control gate and increasing the channel voltage to a high voltage, thereby creating an electric field that causes electrons to be pushed back into the semiconductor substrate. This process is diagrammatically illustrated in FIG. 12A, which generally depicts a two-dimensional NAND-type memory cell configuration 1000 comprising a control gate 1010, a floating gate 1020, and the underlying semiconductor substrate 1030 (e.g., polysilicon) comprising the memory cell's source and drain terminals (see 1040 and 1050, respectively). According to this particular embodiment, a relatively low voltage (0.5 V, for example) is applied to the control gate 1010 and a relatively high voltage VERA (20 V, for example) is applied to the substrate body 1030, causing the electron charges (−) trapped at the floating gate 1020 to be pushed back into the substrate 1030. Similarly, depicted in FIG. 12B is a diagrammatic view of a general erase process with respect to a three-dimensional NAND-type memory cell configuration 1100, according to an exemplary embodiment. Here, a relatively low voltage (e.g., ~0.5 V) is applied to the appropriate word line 1110 and a relatively high voltage VERA (e.g., ~20 V) is applied to a channel 1140 of the memory structure 1130, the channel being comprised of holes. As a result, the electron charges (−) are pushed out of the charge trapping layer 1120.

As described above, global bit lines (BLs) of a memory array structure connect the memory cells to the sense amplifiers used in the memory (sensing) operations. For example, as described above with respect to the exemplary embodiment illustrated in FIG. 10, each NAND string is connected to a bit line and the sense amplifiers (SAs) are located on the periphery of the array 900, wherein each sense amplifier connects to a single bit line. During erase operations in some memory circuit designs, such as the exemplary BiCS-type array embodiment depicted in FIGS. 9-11, the associate bit lines (BLs) will couple to the erase voltage VERA, which can be in the relatively high voltage range of 20V to 24V, thereby taking the bit lines to a high voltage. However, the sense amplifiers (SAs) generally operate at lower voltages, such as VSS (0V), the high logic level (VDD 2-3V), and, in some embodiments, a VDDSA (used in pre-charging bit lines for sensing operations) that is in the 4-5V range. Therefore, additional circuitry is implemented in order to protect the transistors of the sense amplifiers (SAs) from being damaged by the high erase voltage, and to protect against bit lines shorting to the adjacent low voltage circuitry. For example, in certain embodiments, each of the bit lines may be connected to an associated sense amplifier through a switch by an internal part of the bit line such that, during an erase operation, the switch is shut off thereby protecting the sense amplifier circuitry and containing the high voltage.

Figure 13:
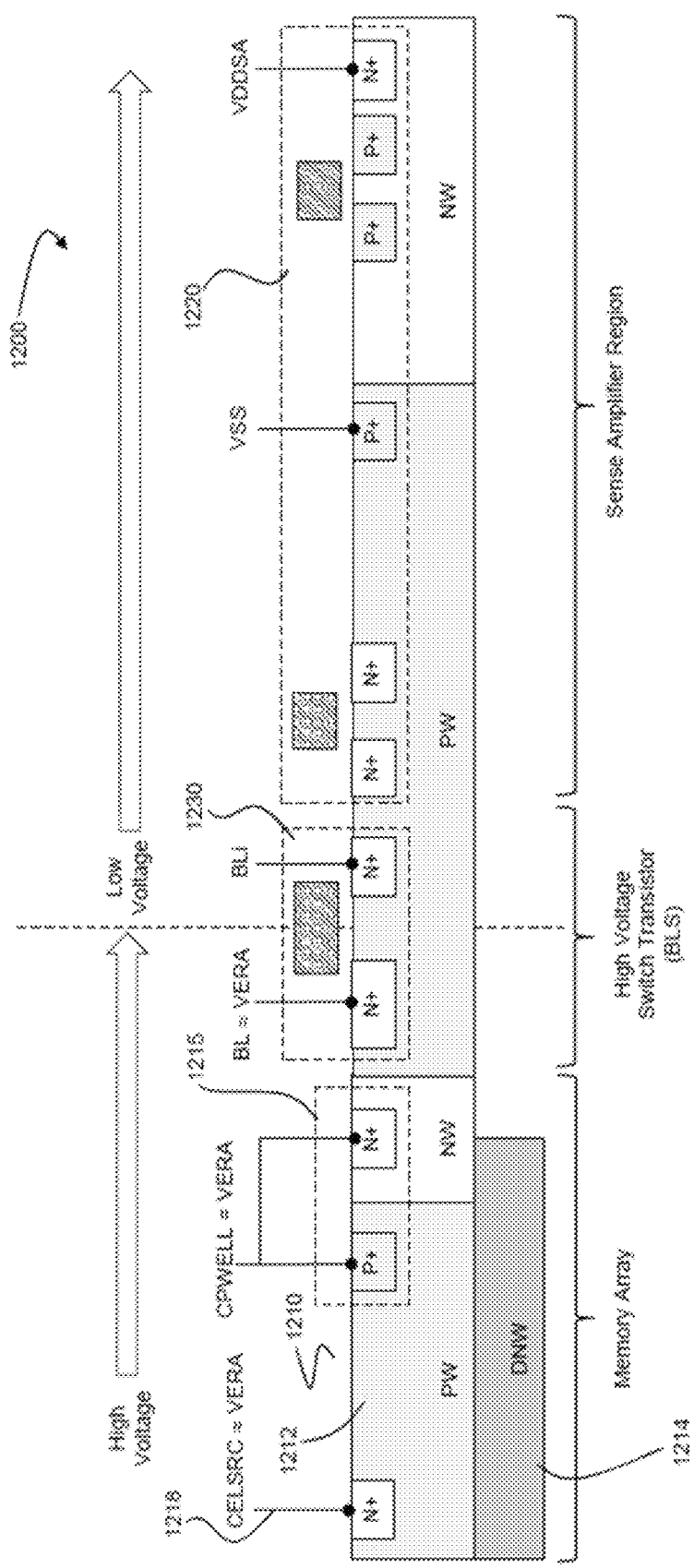
FIG. 13 is a schematic view of a cross section of a memory structure, depicting the use of a high voltage switch transistor (BLS) for isolating the low voltage peripheral components from a high erase voltage (VERA), in accordance with exemplary embodiments.
Figure 14:
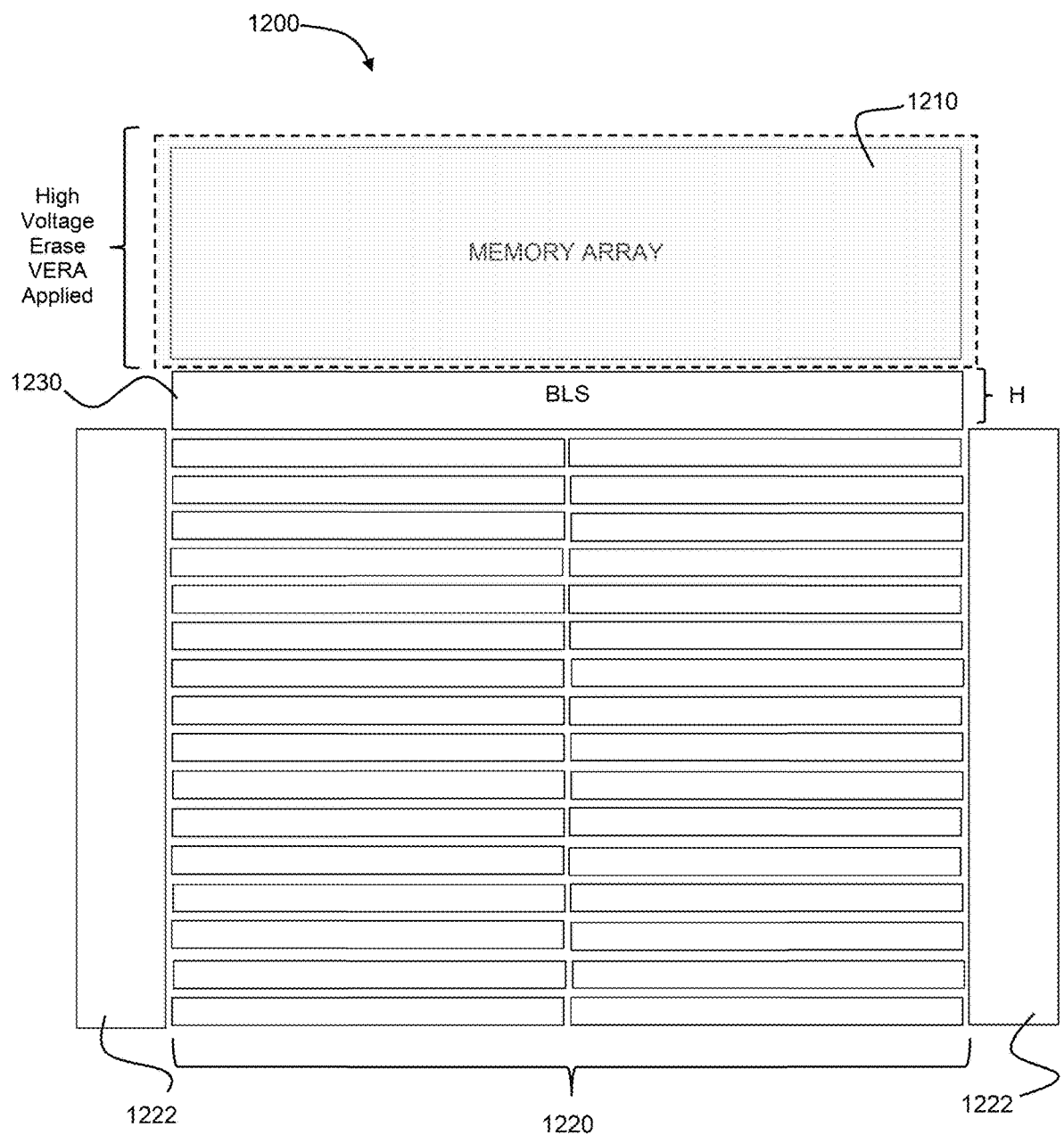
FIG. 14 is a block diagram depicting a layout of the voltage isolation mechanism according to the exemplary embodiment of FIG. 13.

Referring now to FIG. 13, there is shown a block diagram generally depicting a cross section of a memory structure 1200 in which the low-voltage sense amplifier circuitry 1220 is effectively isolated from the high erase voltage VERA being applied to the P-well region of the memory element 1210 by an intermediate high voltage switch transistor (BLS) 1230 disposed in-between the sense amplifier circuitry 1220 and a respective bit line (BL) of the memory element 1210, according to an exemplary embodiment. It is understood that, in the case of a two-dimensional NAND-type memory structure, the high erase voltage VERA is applied to the bulk substrate, whereas, in the context of a three-dimensional NAND memory structure, the high erase voltage VERA is applied to the memory hole complex of the structure. With respect to this particular embodiment, the high erase voltage VERA is applied to the CPWELL 1215 of the memory element 1210 by way of the associated P+ and N+ well taps such that the high erase voltage VERA propagates to CELSRC 1218 via the P+ and N+ well taps, including the leftmost N+ well pictured in FIG. 13. Further, a deep N-well (DNW) 1214 is also formed in the high-voltage region by masking the substrate 1212 as is known in the art and implanting N-type ions to create an N-type diffusion, thereby further isolating high-voltage components. Depicted in FIG. 14 is a block diagram representation of the layout of memory structure 1200 in accordance with the exemplary embodiment of FIG. 13. As is indicated, the high erase voltage VERA is applied only to the memory array (comprised of memory elements 1210), whereas, the sense amplifier region 1220, including the sense amplifier drivers 1222, is isolated from the high voltage by virtue of the intermediate high voltage switch transistor (BLS) 1230.

While this general scheme provides the necessary isolation to sufficiently protect the sense amplifier region 620, a distinct disadvantage is the additional bit line length resulting from the increased height (H) of the memory structure due solely to the presence of the intermediate high voltage switch transistor (BLS) component. Each bit line (BL) of the memory structure requires one high voltage switch transistor. Therefore, in practice, the added height (H) is very significant. For example, in a memory structure that is comprised of 16 KB worth of bit lines (BL), a total of 16×8×1024 high voltage switch transistors (BLS) is required, which, according to, for example, the layout of the exemplary embodiment of FIGS. 13 and 14, results in an additional height (H) of approximately 80 μm to the memory structure.

Figure 15:
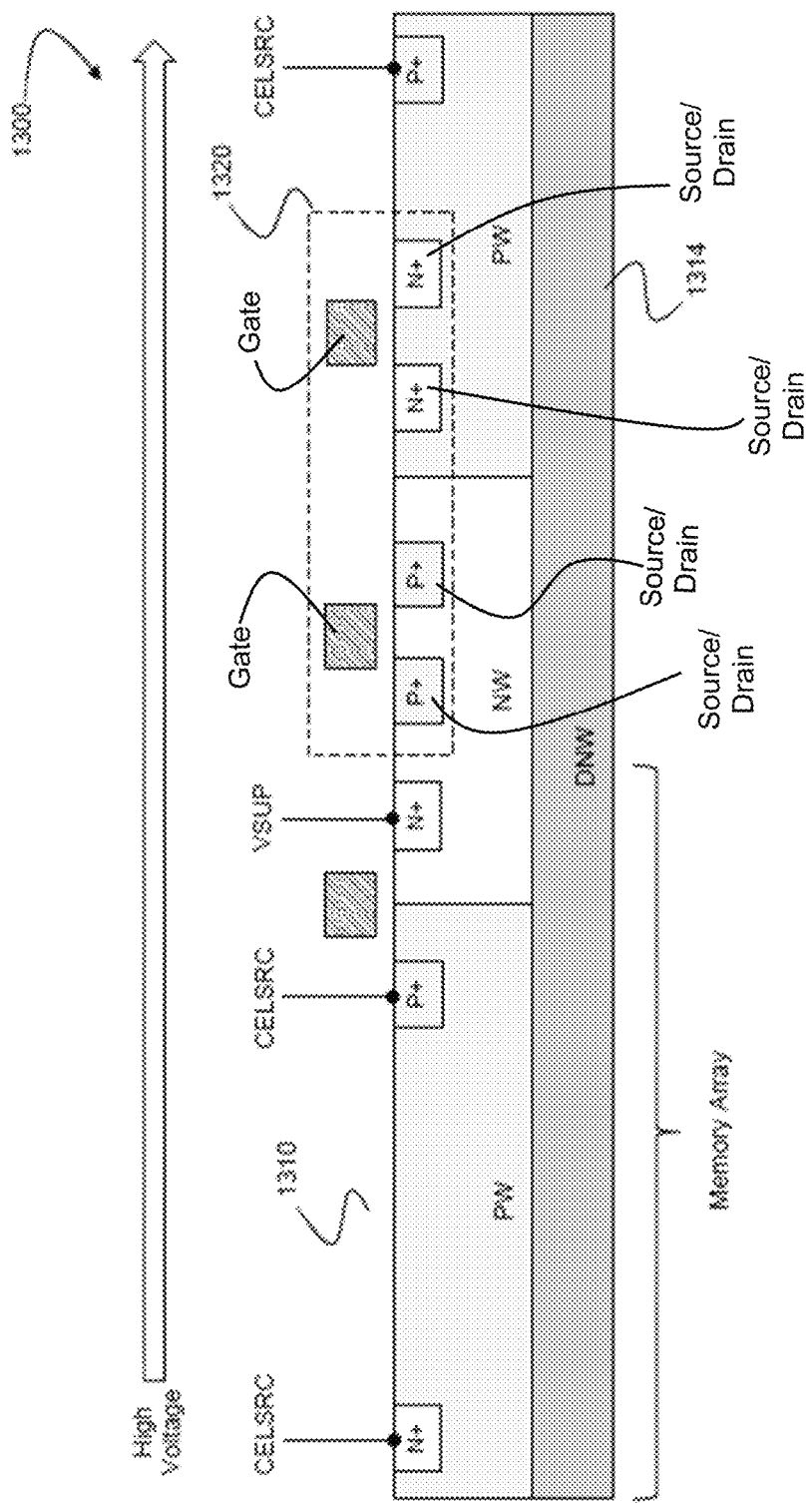
FIG. 15 is a schematic view of a cross section of a memory structure, depicting the use of a deep N-well region for isolating the low voltage peripheral components from a high erase voltage (VERA), in accordance with exemplary embodiments.
Figure 16:
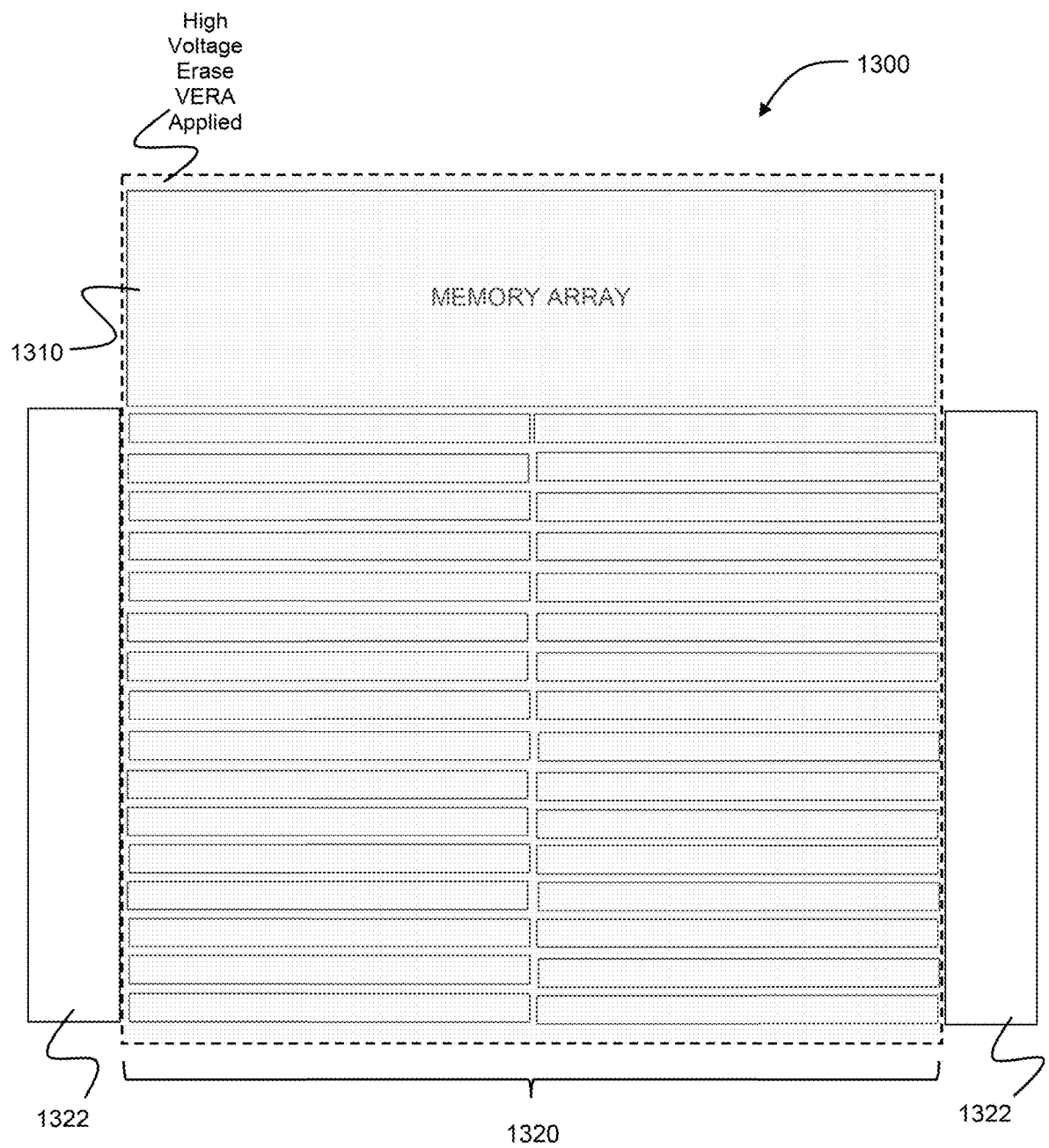
FIG. 16 is a block diagram depicting a layout of the voltage isolation mechanism according to the exemplary embodiment of FIG. 15.

Accordingly, depicted in FIG. 15 is representative cross section of an alternative exemplary embodiment of a memory structure 1300 for producing the desired protection of the low voltage transistors of the sense amplifier region without the introduction of any intermediate high voltage switch transistors (BLS). Specifically, in contrast to the exemplary embodiment of FIGS. 13 and 14, a deep N-well (DNW) 1314 is formed at the substrate such that, in addition to the memory element 1310, all of the low voltage (LV) transistors of the sense amplifier region 1320 (both the PHOS and NMOS), are also placed on the deep N-well (DNW) 1314 region. Therefore, as a result of this configuration, the high erase voltage VERA may be applied to all terminals of each of the low voltage transistors (i.e., source, drain, gate, and bulk) in the sense amplifier region 1320 without the risk of damage as the voltage isolation that is provided by the deep N-well region 1314 shields the low voltage transistors from exposure to the large voltage differences. Provided in FIG. 16 is a block diagram representation of the layout of memory structure 1300 in accordance with the exemplary embodiment of FIG. 15. As indicated, the high erase voltage VERA is applied to the entireties of the memory element 1310 and the sense amplifier region 1320, as made possible by the application of the deep N-well 1314 region to all nodes. However, as also indicated in the layout shown in FIG. 16, the sense amplifier drivers 1322, which also are comprised of low voltage transistors, are also susceptible to the high erase voltage VERA and, therefore, it is still necessary to isolate/cut the low voltage outside circuitry from the high voltage sense amplifier circuitry at the sense amplifier signal drivers 1322. In addition, it is necessary to ensure that any large voltage differences are not present between the nodes of the low voltage transistors in the sense amplifier region 1320 as driven by the outside circuitry, i.e., the sense amplifier drivers 1322.

In determining a suitable mechanism for isolating the sense amplifier drivers 1322, several considerations must be made. For example, due to the fact that some sense amplifier signals operate at high speed during, for example, read and/or programming memory operations, it is essential not to degrade their performance speed by, again, the approach of inserting an isolation high voltage transistor, which may generate an undesirable high resistance and capacitance in the control signal path. Beneficially, because there are less control signals going into a memory structure than there are bit lines (BL), isolating the sense amplifier drivers 1322 using a high voltage switch transistor does not consume as much area in comparison to the circumstance of the memory structures in FIGS. 13-14 in which high voltage switch transistors (BLS) are incorporated at the bit line (BL) level to isolate the sense amplifier region therein. Furthermore, in order to protect the sense amplifier drivers 1322, it is important to prevent significant voltage differences from occurring between the nodes (e.g., between the source and gate) of the low voltage transistors as a result of the application of the high erase voltage VERA. For example, in the case in which an inadvertent leak current occurs at a node of a low voltage transistor in the sense amplifier region, the voltage of the node may decline or droop, thereby causing an excessive voltage between the gate and bulk nodes of the low voltage transistor. Accordingly, a suitable sense amplifier driver configuration must prevent these large voltage difference events.

Figure 17:
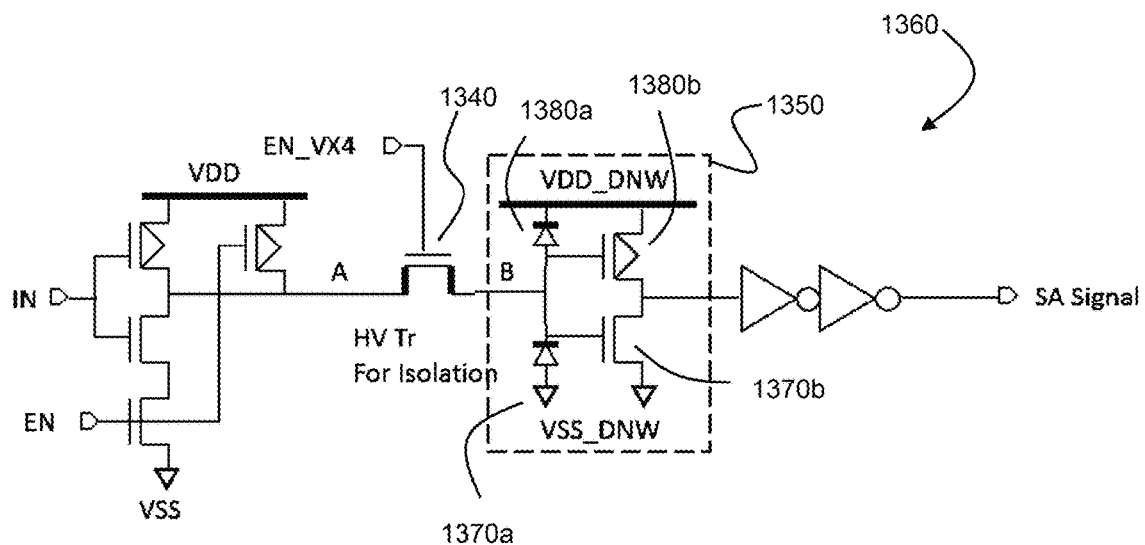
FIG. 17 is a schematic view of a voltage isolation circuit at the sense amplifier driver region of a memory structure, in accordance with exemplary embodiments.
Figure 18:
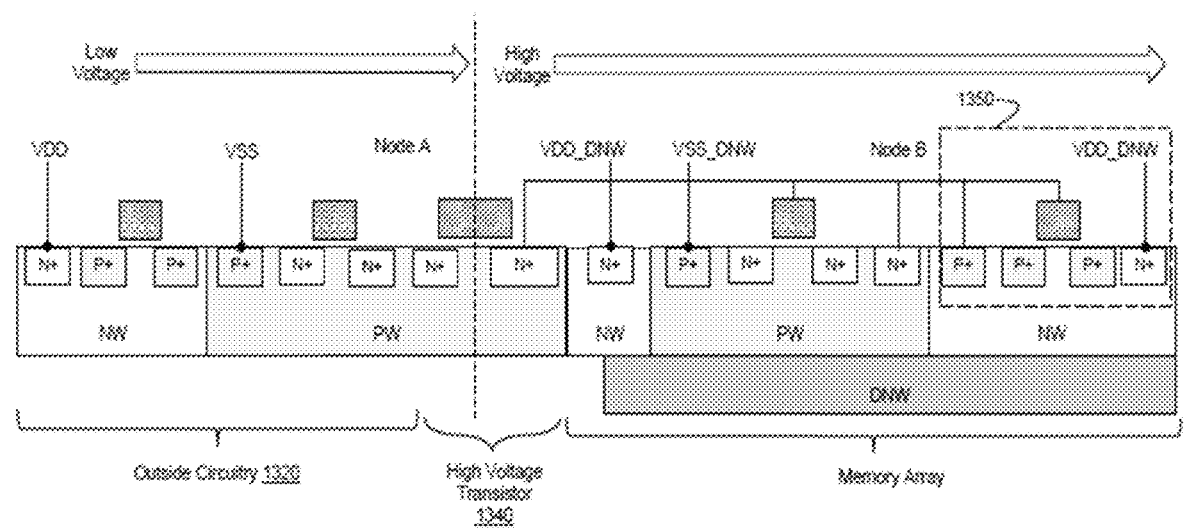
FIG. 18 is a schematic view of a cross section of a memory structure in which there is incorporate the voltage isolation circuit according to the exemplary embodiment of FIG. 17.

Illustrated in FIG. 17 is an exemplary embodiment of a voltage isolation circuit 1360 which may be incorporated at a first stage position of a sense amplifier driver of a memory structure (such as memory structure 1300 of FIGS. 15 and 16). As shown, a high voltage switch transistor 1340 effectively cuts off the low voltage components of the outside or peripheral circuitry, which is present at node A, from the high voltage components (present at node B). Furthermore, there is a circuit element 1350 that is applied to, for example, the gate of a low voltage transistor to ensure that large voltage differences as a result of the application of a high erase voltage do not occur. As depicted, circuit element 1350, according to one exemplary embodiment, is comprised of a first diode 1370*a*, a first transistor 1370*b*, a second diode 1380*a*, and a second transistor 1380*b*. In operation, application of a high erase voltage (VERA) on the memory array side (i.e., at the right-hand side of node B) will cause the first diode 1370*a* to turn off, thereby preventing the high voltage from causing a large, destructive voltage difference in the low voltage transistor components (i.e., at the left-hand side of node A). Importantly, in this exemplary embodiment, the high voltage switch transistor 1340 and circuit element 1350 are disposed in close physical proximity to each other in order to minimize the amount of resistance and capacitance created by the incorporation of the high voltage switch transistor 1340 and the circuit element 1350, such that any impact on the speed performance is negligible. Depicted in FIG. 18 is a representative cross section of a memory structure (e.g., 1300) in which the voltage isolation circuit 1360 of FIG. 17 is incorporated, according to an exemplary embodiment. As a result of the voltage isolation circuit 1350, node A remains at a low voltage during an erase operation and the voltage at node B will remain close to the high erase voltage (VERA), even in the presence of an inadvertent leak current, by virtue of the diode 1380*a* connected to it. Further, in order to mitigate the stress of the HVSW, the voltage at node A may be applied with VDD by setting EN to 0 (see FIG. 17). Additionally, with respect to FIGS. 17 and 18, VDD_DNW and VSS_DNW, as well as all other sense amplifier power nodes, can either be explicitly applied by the high erase voltage (VERA) or be floating. Due to the presence of the many diffusions, the forward-biased P-N junction will, accordingly, ensure that the VERA voltage propagates to those power sources. The sense amplifier power source and VDD_DNW/VSS_DNW can be either the same or separate.

Accordingly, by eliminating the high voltage switch transistors (BLS) from the bit line level and only incorporating high voltage switch transistors at the sense amplifier driver region, there is a significant reduction of the total area of the high transistor area, thereby reducing the cost. Hence, this approach is particularly effective in the context of the ultra-low read latency NAND-type memory structure that is described above in connection with FIGS. 7A-7D and 8. Specifically, if the BLS configuration of FIGS. 13 and 14 were used, a BLS region would be required at every boundary of a sub-plane (850-0, . . . , 850-*n*) and sense amplifier region (840-0, . . . , 840-*n*+1). By contrast, using the voltage isolation circuit according to the exemplary embodiment of FIGS. 17 and 18, which completely eliminates the use of the BLS transistors, a high voltage transistor is instead placed in the sense amplifier drive region (see 842 in FIG. 7B), thereby drastically reducing the number of high voltage transistors and decreasing the bit line capacitance.

Figure 19:
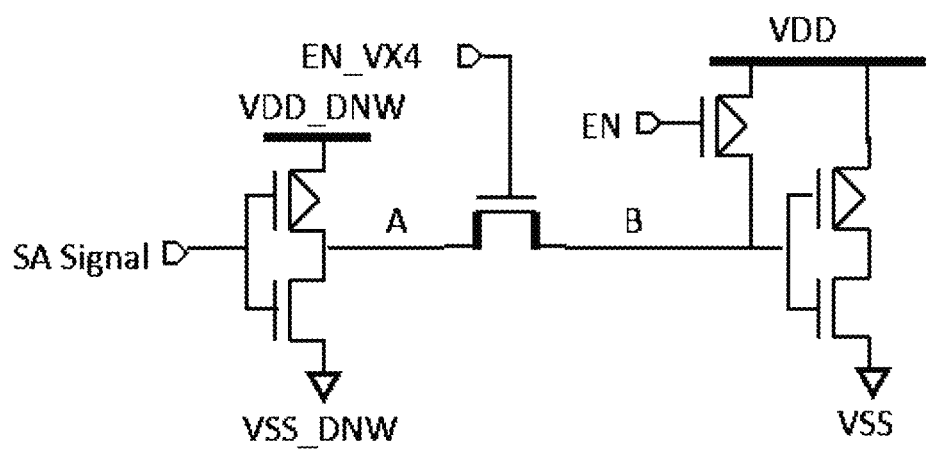
FIG. 19 is a schematic view of a voltage isolation circuit that may be applied to a receiving circuit that takes data out of a memory array, in accordance with exemplary embodiments.

Further, FIG. 19 is a schematic depiction of an exemplary embodiment of a voltage isolation circuit that may be applied to a receiving circuit that takes data out of a memory array, wherein the isolation circuit operates according to a similar philosophy as the voltage isolation circuit of FIGS. 17 and 18.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A memory device, comprising:
   a semiconductor substrate in which a memory cell region and a peripheral circuitry region are defined, the memory cell region having a plurality of non-volatile memory cells arranged in one or more arrays, and the peripheral circuitry region having at least one sense amplifier region comprised of at least one low voltage transistor; and
   a deep N-well region formed in the substrate, wherein the memory cell region and the peripheral circuitry region are placed on the deep N-well region such that, in the event that a high erase voltage (VERA) is applied to the memory cell region during an erase operation, the high erase voltage is applied to all terminals of the at least one low voltage transistor, thereby preventing the at least one low voltage transistor from experiencing a large voltage difference between its terminals.

2. The memory device according to claim 1, wherein the plurality of non-volatile memory cells are three-dimensional NAND-type flash memory cells.

3. The memory device according to claim 1, further comprising at least one controller communicating with the memory cell region.

4. The memory device according to claim 1, wherein the memory cell region further comprises a plurality of three-dimensional co-planar memory cell planes arranged in a plane parallel to the semiconductor substrate, wherein each plane is comprised of a plurality of sub-planes disposed adjacent one another along an axis parallel to the semiconductor substrate.

5. The memory device according to claim 4, wherein the peripheral circuitry region further comprises a plurality of sense amplifier regions arranged along the axis in an alternating pattern with the plurality of sub-planes such that adjacent to each sub-plane is a sense amplifier region.

6. The memory device according to claim 3, wherein the peripheral circuitry region further comprises at least one sense amplifier driver region operatively connected to the at least one controller and the at least one sense amplifier region, and operable to provide control signals to the memory cell region, wherein the at least one sense amplifier driver region is comprised of at least one low voltage transistor.

7. The memory device according to claim 6, further comprising a voltage isolation circuit operatively connected to the sense amplifier driver region such that the at least one low voltage transistor of the sense amplifier driver region is effectively isolated from a high erase voltage (VERA) applied to the memory cell region.

8. The memory device according to claim 7, wherein the voltage isolation circuit comprises a high voltage switch transistor.

9. The memory device according to claim 8, wherein the voltage isolation circuit further comprises a sub-circuit positioned on a high voltage side of the high voltage switch transistor, the sub-circuit comprising:
 a first diode;
 a first transistor placed in series with the first diode;
 a second diode; and
 a second transistor placed in series with the second diode, the sub-circuit preventing the at least one low voltage transistor of the sense amplifier driver region from experiencing a large voltage difference between terminals in the event a high erase voltage (VERA) is applied to the memory cell region.

10. A memory device, comprising:
 a semiconductor substrate in which a memory cell region and a peripheral circuitry region are defined, the memory cell region having a plurality of non-volatile memory cells arranged in one or more arrays, and the peripheral circuitry region having at least one sense amplifier region and at least one sense amplifier driver region, each of the sense amplifier region and sense amplifier driver region being comprised of at least one low voltage transistor;
 at least one controller communicating with the memory cell region, wherein the at least one sense amplifier driver region is:
  operatively connected to the at least one controller and the at least one sense amplifier region; and
  operable to provide control signals to the memory cell region; and
 a voltage isolation circuit operatively connected to the sense amplifier driver region such that, in the event a high erase voltage (VERA) is applied to the memory cell region during an erase operation, the at least one low voltage transistor of the sense amplifier driver region is effectively isolated from the high erase voltage (VERA).

11. The memory device according to claim 10, wherein the voltage isolation circuit comprises a high voltage switch transistor.

12. The memory device according to claim 11, wherein the voltage isolation circuit further comprises a sub-circuit positioned on a high voltage side of the high voltage switch transistor, the sub-circuit comprising:
 a first diode;
 a first transistor placed in series with the first diode;
 a second diode; and
 a second transistor placed in series with the second diode, the sub-circuit preventing the at least one low voltage transistor of the sense amplifier driver region from experiencing a large voltage difference between terminals in the event a high erase voltage (VERA) is applied to the memory cell region.

13. The memory device according to claim 10, wherein the plurality of non-volatile memory cells are three-dimensional NAND-type flash memory cells.

14. The memory device according to claim 10, wherein the memory cell region further comprises a plurality of three-dimensional co-planar memory cell planes arranged in a plane parallel to the semiconductor substrate, wherein each plane is comprised of a plurality of sub-planes disposed adjacent one another along an axis parallel to the semiconductor substrate.

15. The memory device according to claim 14, wherein the peripheral circuitry region comprises a plurality of sense amplifier regions arranged along the vertical axis in an alternating pattern with the plurality of sub-planes such that adjacent to each sub-plane is a sense amplifier region.

16. A method for effectively isolating a low voltage sense amplifier region of a non-volatile memory device from a high erase voltage (VERA) applied during a memory erase operation, comprising:
 in a memory device having a semiconductor substrate in which a memory cell region and a peripheral circuitry region are defined, wherein the peripheral circuitry region has at least one sense amplifier region comprised of at least one low voltage transistor:
  forming a deep N-well region in the substrate; and
  placing the memory cell region and the peripheral circuitry region on the deep N-well region such that, in the event a high erase voltage (VERA) is applied to the memory cell region during an erase operation, the high erase voltage (VERA) is applied to all terminals of the at least one low voltage transistor, thereby preventing the at least one low voltage transistor from experiencing a large voltage difference between its terminals.

17. The method according to claim 16, wherein the memory cell region comprises a plurality of three-dimensional NAND-type flash memory cells.

18. The method according to claim 16, further comprising operatively connecting a voltage isolation circuit to at least one sense amplifier driver region of the periphery circuitry region, wherein the at least one sense amplifier driver region:
 is operatively connected to at least one controller of the memory device and to the at least one sense amplifier region;
 is operable to provide control signals to the memory cell region; and
 comprises at least one low voltage transistor.

19. The method according to claim 18, further comprising:
 using the voltage isolation circuit, effectively isolating the at least one low voltage transistor of the sense amplifier driver region from a high erase voltage (VERA) applied to the memory cell region.

20. The method according to claim 19, wherein the voltage isolation circuit comprises a high voltage switch transistor.

* * * * *